(12) United States Patent
Kondo

(10) Patent No.: US 9,322,113 B2
(45) Date of Patent: Apr. 26, 2016

(54) TANTALUM CARBIDE-COATED CARBON MATERIAL AND MANUFACTURING METHOD FOR SAME

(75) Inventor: Mika Kondo, Kanonji (JP)

(73) Assignee: TOYO TANSO CO., LTD., Osaka-shi (JP)

( * ) Notice: Subject to any disclaimer, the term of this patent is extended or adjusted under 35 U.S.C. 154(b) by 832 days.

(21) Appl. No.: 13/519,695

(22) PCT Filed: Dec. 28, 2010

(86) PCT No.: PCT/JP2010/073810
§ 371 (c)(1),
(2), (4) Date: Jun. 28, 2012

(87) PCT Pub. No.: WO2011/081210
PCT Pub. Date: Jul. 7, 2011

(65) Prior Publication Data
US 2012/0301723 A1 Nov. 29, 2012

(30) Foreign Application Priority Data

Dec. 28, 2009 (JP) ................................ 2009-298916

(51) Int. Cl.
| | |
|---|---|
| *B32B 9/00* | (2006.01) |
| *C30B 29/36* | (2006.01) |
| *C04B 41/00* | (2006.01) |
| *C04B 41/50* | (2006.01) |
| *C04B 41/87* | (2006.01) |
| *C23C 16/14* | (2006.01) |
| *C23C 16/32* | (2006.01) |
| *C23C 16/56* | (2006.01) |
| *C30B 25/02* | (2006.01) |
| *C04B 111/00* | (2006.01) |

(52) U.S. Cl.
CPC ............... *C30B 29/36* (2013.01); *C04B 41/009* (2013.01); *C04B 41/5057* (2013.01); *C04B 41/87* (2013.01); *C23C 16/14* (2013.01); *C23C 16/32* (2013.01); *C23C 16/56* (2013.01); *C30B 25/02* (2013.01); *C04B 2111/0025* (2013.01); *C04B 2111/00405* (2013.01); *Y10T 428/30* (2015.01)

(58) Field of Classification Search
None
See application file for complete search history.

(56) References Cited

U.S. PATENT DOCUMENTS

| | | | |
|---|---|---|---|
| 2007/0059501 A1 | 3/2007 | Kaneko et al. | |
| 2011/0017517 A1* | 1/2011 | Scott et al. | 175/374 |
| 2012/0040172 A1 | 2/2012 | Fujiwara et al. | |

FOREIGN PATENT DOCUMENTS

| | | |
|---|---|---|
| CN | 1844446 A | 10/2006 |
| CN | 1942415 A | 4/2007 |

(Continued)

OTHER PUBLICATIONS

Office Action issued Oct. 14, 2014 in Japanese Patent Application No. 2010-294097 (with English language translation).

(Continued)

*Primary Examiner* — Humera Sheikh
*Assistant Examiner* — Seth Dumbris
(74) *Attorney, Agent, or Firm* — Oblon, McClelland, Maier & Neustadt, L.L.P.

(57) ABSTRACT

On the surface of a carbon substrate 41, a tantalum carbide coating film 42 is formed to coat the carbon substrate 41. The tantalum carbide coating film 42 has a maximum peak value of at least 80 degrees in an orientation angle of a (311) plane corresponding to a diffraction peak of tantalum carbide as determined by X-ray diffraction.

4 Claims, 24 Drawing Sheets

(56) References Cited

FOREIGN PATENT DOCUMENTS

| | | | | |
|---|---|---|---|---|
| CN | 101153384 | A | 4/2008 | |
| EP | 0 817 283 | A1 | 1/1988 | |
| EP | 1 852 407 | A1 | 11/2007 | |
| JP | 05-320910 | | 7/1993 | |
| JP | 5-238856 | A | 9/1993 | |
| JP | 7-118854 | A | 5/1995 | |
| JP | 8-100265 | A | 4/1996 | |
| JP | 10-245285 | A | 9/1998 | |
| JP | 11-314970 | A | 11/1999 | |
| JP | 2003-133246 | A | 5/2003 | |
| JP | 2004 84057 | | 3/2004 | |
| JP | 2005 68002 | | 3/2005 | |
| JP | 2008-050626 | A | 3/2008 | |
| JP | 2008-81362 | | 4/2008 | |
| RU | 344033 | | 7/1972 | |
| RU | 2 090 648 | C1 | 9/1997 | |
| TW | 200636100 | A | 10/2006 | |
| WO | WO2005/056873 | * | 6/2005 | ............. C23C 16/01 |
| WO | 2006 085635 | | 8/2006 | |

OTHER PUBLICATIONS

Combined Chinese Office Action and Search Report issued Nov. 20, 2013 in Patent Application No. 201080064887.0 with English translation and English translation of categories of cited documents.

Office Action issued Nov. 26, 2013 in Japanese Patent Application No. 2010-294084 with English language translation.

Extended European Search Report issued Dec. 18, 2013 in Patent Application No. 10841065.5.

Xiang Xiong, et al., "Surface morphology and preferential orientation growth of TaC crystals formed by chemical vapor deposition" Thin Solid Films, vol. 517, No. 11, 2009, pp. 3235-3239.

Zhao-ke Chen, et al., "Phase composition and morphology of TaC coating on carbon fibers by chemical vapor infiltration", Thin Solid Films, vol. 516, No. 23, 2008, pp. 8248-8254.

Office Action issued Nov. 15, 2014 in Chinese Patent Application No. 201080064887.0 (with English language translation).

Combined Taiwanese Office Action and Search Report issued Nov. 19, 2014 in Patent Application No. 099146663 (with English language translation and English translation of categories of cited documents).

Office Action issued Dec. 19, 2014 in Russian Patent Application No. 2012132436 (with English translation).

Y.S. Eliseev et al., "Chemical and Thermal Treatment and Protective Coatings in Aircraft Engine Construction", Moscow, Higher school, 1999, p. 326 (3 pages) (with partial English translation).

N.V. Abraimov et al., "Chemical and Thermal Treatment of Refractory Steels and Alloys", Moscow, Internet Engineering, 2001, p. 287, (3 pages) (with partial English translation).

Novikov I.I., "Theory of Thermal Treatment of Metals, Moscow, Metallurgy", 1986, p. 82-83 (5 pages) (with partial English translation).

Driza M. E., "Properties of Elements", Moscow, Ore and Metals, 2003, Book 1, p. 248, (3 pages) (with partial English translation).

Office Action issued Mar. 4, 2014 in Japanese Patent Application No. 2010-294097 (with English language translation).

Office Action issued Feb. 25, 2014 in Japanese Patent Application No. 2010-294073 (with English language translation).

Office Action issued Feb. 25, 2014 in Japanese Patent Application No. 2010-294082 (with English language translation).

Office Action issued Feb. 25, 2014 in Japanese Patent Application No. 2010-294071 (with English language translation).

International Search Report Issued Mar. 29, 2011 in PCT/JP10/73810 Filed Dec. 28, 2010.

International Preliminary Report on Patentability issued Aug. 23, 2012 in PCT/JP2010/073810 Filed Dec. 28, 2010.

Written Opinion of the International Searching Authority issued Mar. 29, 2011 in PCT/JP2010/073810 with English Translation.

Combined Office Action and Search Report issued Jul. 2, 2014 in Chinese Patent Application No. 201080064887.0 (with English translation).

Office Action issued Jul. 8, 2014 in Japanese Patent Application No. 2010-294097 (with English translation).

Combined Chinese Office Action and Search Report issued May 6, 2015 in Patent Application No. 201410118060.3 (with partial English language translation and English translation of categories of cited documents).

* cited by examiner (a)

(b)

(a)

(b)

(c)

(d)

(a)

(b) 
TANTALUM COATING FILM (c)

F IG .8 (a)
EXAMPLE 1
900°C
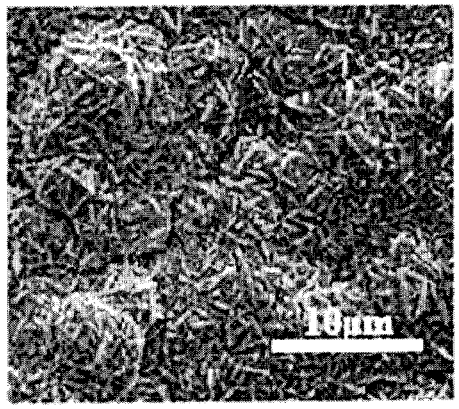
EXAMPLE 2
950°C
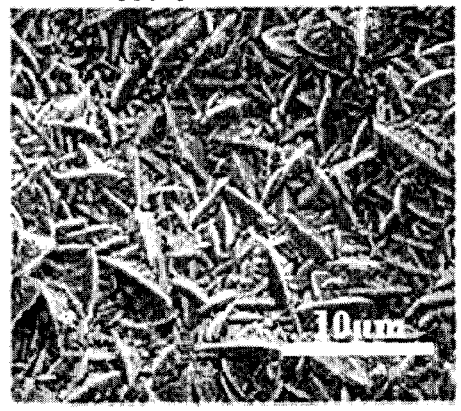
EXAMPLE 3
1000°C
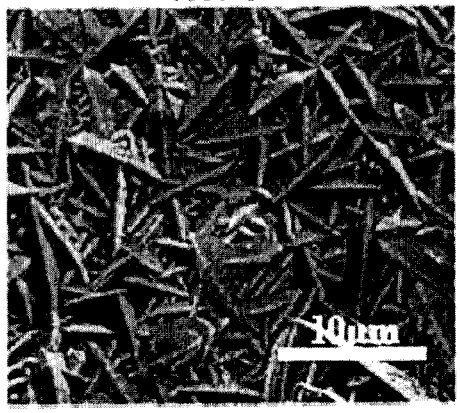
EXAMPLE 4
1050°C
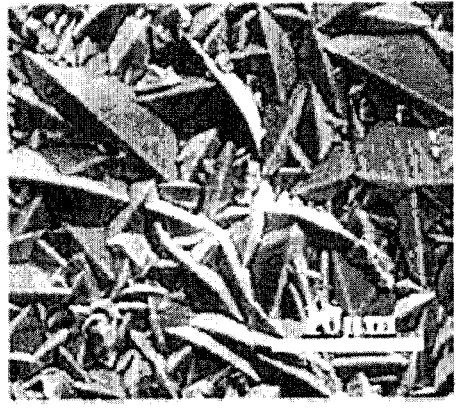

EXAMPLE 1

EXAMPLE 2

EXAMPLE 3

EXAMPLE 4

(a)

(220) PLANE (b)

(311) PLANE

EXAMPLE 5

EXAMPLE 6

EXAMPLE5

EXAMPLE6

F IG .13
EXAMPLE 7 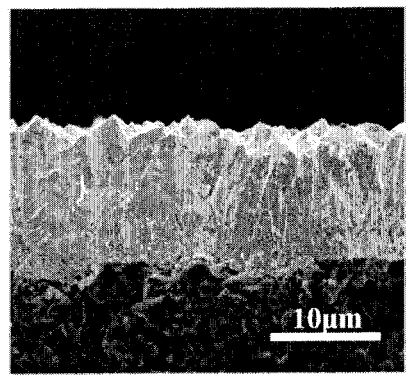 EXAMPLE 8 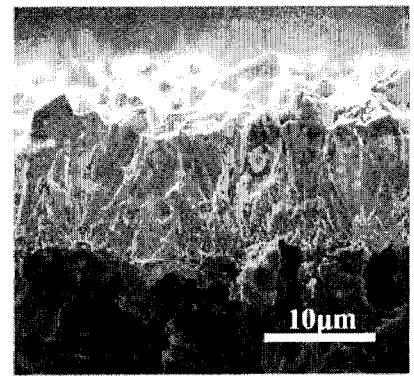

EXAMPLE7

EXAMPLE8

(a)

(220) PLANE (b)

(311) PLANE (a)

(220) PLANE (b)

(311) PLANE (a) (220) PLANE (b) (311) PLANE (a) (220) PLANE (b) (311) PLANE

F IG .25
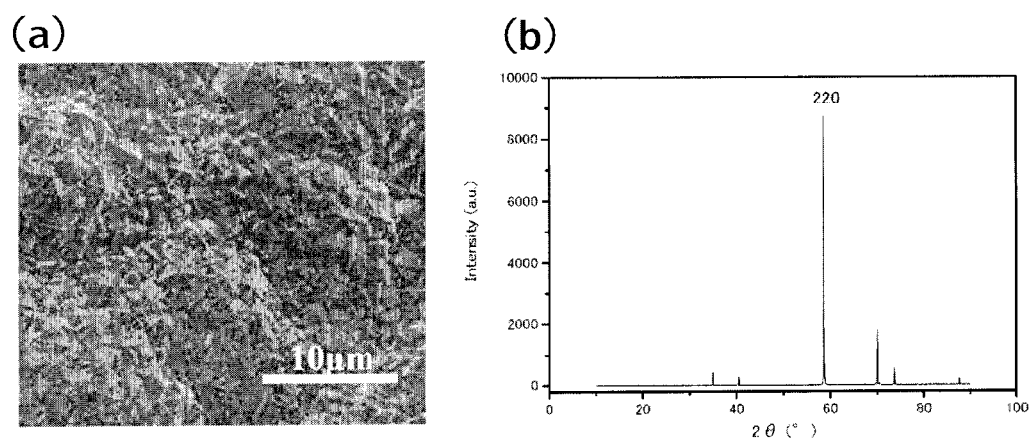
(a) (b)

(a) (220) PLANE (b) (311) PLANE

TANTALUM CARBIDE-COATED CARBON MATERIAL AND MANUFACTURING METHOD FOR SAME

TECHNICAL FIELD

The present invention relates to a tantalum carbide-coated carbon material having a carbon substrate and a tantalum carbide coating film formed thereon, and a manufacturing method of the tantalum carbide-coated carbon material.

BACKGROUND ART

Tantalum carbide is heat resistant and gas etching resistant. Therefore a tantalum carbide-coated carbon material formed by coating a carbon material with a tantalum carbide film is used for components of an apparatus for manufacturing single crystal semiconductor such as Si, SiC, and GaN.

According to Patent Literature 1, because a tantalum carbide layer is amorphous, the anisotropy of the tantalum carbide crystal is lowered so that the size of a chemically or physically weak part is reduced on the surface of the tantalum carbide layer. On the other hand, a tantalum carbide coating film recited in Patent Literature 2 is arranged so that the corrosion resistance and the thermal shock resistance of a tantalum carbide-coated carbon material are improved by specifically developing the (220) plane corresponding to the diffraction peak of tantalum carbide observed by X-ray diffraction as compared to other Miller planes.

CITATION LIST

Patent Literature

Patent Literature 1: Japanese Patent No. 3938361
Patent Literature 2: Japanese Patent No. 3779314

SUMMARY OF INVENTION

Technical Problem

As described above, the tantalum carbide layer recited in Patent Literature 1 is amorphous. Furthermore, in the tantalum carbide coating film recited in Patent Literature 2, crystal grains have already been transformed from amorphous to crystal but small crystal grains are coagulated. As such, there are enormous grain boundaries in the tantalum carbide layers of Patent Literatures 1 and 2.

Because the grain boundaries of tantalum carbide tend to capture residual substances, the amount of residual substances in the tantalum carbide coating film increases as the number of grain boundaries increases. Furthermore, the grain boundaries have a lower strength than crystal grains. For this reason, destruction tends to occur from such grain boundaries at high temperatures. Furthermore, the residual substances are released along the grain boundaries, thereby forming voids on the surface of the tantalum carbide coating film. For these reasons, the life of the tantalum carbide-coated carbon material is short when the tantalum carbide coating film of Patent Literatures 1 and 2 having enormous grain boundaries is used.

In the meanwhile, a tantalum carbide coating film is typically formed on the surface of a carbon substrate while supporting the carbon substrate from below by a jig. In this regard, because no tantalum carbide coating film is formed at a part where the carbon substrate contacts the jig, the tantalum carbide-coated carbon material is not heat resistant and gas etching resistant at this part. To solve this problem, the tantalum carbide coating film is formed on the entire surface of the carbon substrate by changing the position of the jig, in each tantalum carbide coating film formation process.

However, in case where the tantalum carbide coating film process recited in Patent Literatures 1 and 2 is carried out plural times, impurities are released from a tantalum carbide coating film which is the base in the second and subsequent tantalum carbide coating film formation processes, with the result that an impurity gas is trapped between two subsequent tantalum carbide coating films. For this reason, a newly-formed tantalum carbide coating film is easily peeled off from a tantalum carbide coating film which is the base. Impurities can be removed from the underlying tantalum carbide coating film which is the base, by means of thermal treatment thereof. However, the crystallinity of the tantalum carbide coating film is increased on account of the thermal treatment. As a result, the new tantalum carbide coating film and the underlying tantalum carbide coating film are different in the crystallinity. It is therefore difficult to cause the new tantalum carbide coating film to closely contact the underlying tantalum carbide coating film.

An object of the present invention is therefore to provide a tantalum carbide-coated carbon material having a tantalum carbide coating film in which the number of grain boundaries is small. In addition to this, another object of the present invention is to provide a tantalum carbide-coated carbon material having a tantalum carbide coating film which is not easily peeled off.

Solution to Problem

According to the present invention, a tantalum carbide-coated carbon material includes: a carbon substrate; and a tantalum carbide coating film on which the carbon substrate is provided, the tantalum carbide coating film having a maximum peak value of at least 80 degrees in an orientation angle of a (311) plane corresponding to a diffraction peak of tantalum carbide as determined by X-ray diffraction.

According to the present invention, because the tantalum carbide coating film has a maximum peak value of at least 80 degrees in the orientation angle of the (311) plane corresponding to a diffraction peak of the tantalum carbide as determined by X-ray diffraction, mainly existing in the tantalum carbide coating film are crystal grains having the (311) planes that are in parallel to the surface of the carbon substrate which is a part of the tantalum carbide coating film. Because this results in the tantalum carbide coating film constituted by sufficiently grown tantalum carbide crystal grains, the number of grain boundaries in the tantalum carbide coating film is considerably reduced as compared to conventional cases. A fine-grained high-strength tantalum carbide coating film is therefore obtained, and the life of the tantalum carbide-coated carbon material is extended.

According to the present invention, the tantalum carbide-coated carbon material is arranged so that the tantalum carbide coating film has a maximum peak value of at least 80 degrees in an orientation angle of a (220) plane corresponding to a diffraction peak of the tantalum carbide as determined by the X-ray diffraction. Because of this, mainly existing in the tantalum carbide coating film are crystal grains having the (220) planes that are in parallel to the surface of the carbon substrate which is a part of the tantalum carbide coating film. Because this results in the tantalum carbide coating film constituted by sufficiently grown tantalum carbide crystal grains, the number of grain boundaries in the tantalum carbide coating film is considerably reduced as compared to conventional cases.

In addition to the above, preferably, the sum of diffraction intensities of the (311) plane and the (220) plane of tantalum carbon crystals in the X-ray diffraction is not lower than 0.5 and not higher than 0.9 as compared to the sum total of diffraction intensities of all crystal planes of the tantalum carbon crystals in the X-ray diffraction. This provides a tantalum carbide coating film in which the tantalum carbide crystal grains are sufficiently grown and the number of grain boundaries is significantly reduced.

In addition to the above, preferably, the intensity of a diffraction line corresponding to the (311) plane or the (220) plane in a X-ray diffraction pattern of the tantalum carbide coating film is the maximum. This makes it possible to reduce the number of grain boundaries in the tantalum carbide coating film as compared to the conventional cases.

In addition to the above, preferably, in the X-ray diffraction pattern of the tantalum carbide coating film, a half value width of the diffraction line of the (220) plane or the (311) plane is 0.2 degrees or lower. Because this results in the tantalum carbide coating film having high crystallinity and constituted by sufficiently grown tantalum carbide crystal grains, the number of grain boundaries in the tantalum carbide coating film is considerably reduced as compared to the conventional cases.

According to the present invention, a tantalum carbide-coated carbon material is arranged to include: a carbon substrate; and a tantalum carbide coating film on which the carbon substrate is provided, crystal grains constituting the tantalum carbide coating film gradually increase in size from a surface of the carbon substrate toward the outer surface of the tantalum carbide coating film. With this, the degree of close contact between the tantalum carbide coating film and the carbon substrate is improved, whereas the number of grain boundaries is significantly reduced.

In addition to the above, according to the present invention, a production method of a tantalum carbide-coated carbon material by forming a tantalum carbide coating film on a carbon substrate includes: a crystalline nucleus formation step of forming tantalum carbide crystalline nuclei on a surface of the carbon substrate; and a crystal growth step of carrying out crystal growth of the tantalum carbide crystalline nuclei after the crystalline nucleus formation step, the crystal growth step having a heating step of gradually increasing a production temperature.

According to the method of the present invention, tantalum carbide crystalline nuclei are formed in the concaves of the carbon substrate surface, and the crystallinity of the tantalum carbide coating film is gradually improved by gradually increasing the production temperature in the crystal growth step. Because this makes it possible to form a tantalum carbide coating film fitting to the irregularities of the carbon substrate surface, the tantalum carbide coating film is not easily peeled off from the carbon substrate, and the number of grain boundaries is small in the tantalum carbide coating film as compared to the conventional cases because the crystallinity is improved around the outer surface of the tantalum carbide coating film.

In addition to the above, preferably, in the crystalline nucleus formation step, the tantalum carbide crystalline nuclei are formed at temperatures of 850 to 950 degrees Celsius. Because of this, sufficient tantalum carbide crystalline nuclei are formed in the concaves of the carbon substrate surface and a tantalum carbide coating film fitting to the irregularities on the surface of the carbon substrate is obtained, with the result that the degree of close contact between the tantalum carbide coating film and the carbon substrate is improved.

In addition to the above, preferably, the heating step involves a temperature difference of 50 degrees Celsius or more. With this, a tantalum carbide coating film fitting to the irregularities of the surface of the carbon substrate is obtained at around the surface of the carbon substrate, whereas a tantalum carbide coating film with grown crystal grains and a small number of grain boundaries is obtained at around the outer surface of the tantalum carbide coating film.

In addition to the above, preferably, after the heating step, the production temperature at the end of the heating step is maintained. This makes it possible to deposit a tantalum carbide coating film having grown crystal grains. Therefore a tantalum carbide coating film including fewer grain boundaries and having a desired thickness as compared to conventional cases is obtained.

In addition to the above, preferably, in the heating step, the production temperature is increased at a constant rate. With this, rapid improvement in the crystallinity of the tantalum carbide crystal grains is prevented and hence the peeling off of the tantalum carbide coating film is prevented. As a result, the crystallinity of the tantalum carbide coating film is gradually improved.

In addition to the above, according to the present invention, in a production method of a tantalum carbide-coated carbon material by forming a tantalum carbide coating film on a carbon substrate through a tantalum carbide coating film formation process, the tantalum carbide coating film formation process includes: a first formation process of forming a first tantalum carbide coating film on a surface of the carbon substrate; and a second formation process of forming at least one tantalum carbide coating film on the first tantalum carbide coating film, the first tantalum carbide coating film having a maximum peak value of at least 80 degrees in an orientation angle of a (311) plane corresponding to a diffraction peak of tantalum carbide as determined by X-ray diffraction.

According to the present invention, the number of grain boundaries in the tantalum carbide coating film formed by the tantalum carbide coating film formation process is significantly small as compared to the conventional cases, and no impurities are released from the tantalum carbide coating film in the tantalum carbide coating film formation process. Therefore no impurity gas is trapped between the base tantalum carbide coating film and the new tantalum carbide coating film. Furthermore, the crystallinity of the base tantalum carbide coating film rarely changes in response to thermal treatment, and hence the crystallinity of the base film is substantially identical with the crystallinity of the new tantalum carbide coating film. The base tantalum carbide coating film and the tantalum carbide coating film therefore closely contact each other because of the substantially no difference in the crystallinity. Furthermore, because the tantalum carbide coating film has a maximum peak value of at least 80 degrees in the orientation angle of the (311) plane corresponding to a diffraction peak of the tantalum carbide as determined X-ray diffraction, mainly existing in the tantalum carbide coating film are crystal grains having the (311) planes that are in parallel to the surface of the carbon substrate which is a part of the tantalum carbide coating film. Because the growth of the crystal grains constituting the tantalum carbide coating film is facilitated, the number of grain boundaries in the tantalum carbide coating film is significantly reduced as compared to the conventional cases. A fine-grained high-strength tantalum carbide coating film is therefore obtained, and the life of the tantalum carbide-coated carbon material is extended.

In addition to the above, preferably, the first formation process and the second formation process are performed while supporting a coating object by a support, and an uncoated part of the coating film formed by the support in the first formation process is coated in the second formation process. With this, the tantalum carbide coating film is formed on the entire surface of the carbon substrate.

In addition to the above, the first formation process includes: a crystalline nucleus formation step of forming tantalum carbide crystalline nuclei on a surface of the carbon substrate; and a crystal growth step of carrying out crystal growth of the tantalum carbide crystalline nuclei after the crystalline nucleus formation step, and the crystal growth step includes: a heating step of gradually increasing a production temperature. On this account, tantalum carbide crystalline nuclei are formed in the concaves of the carbon substrate surface, with the result that a tantalum carbide coating film fitting to the irregularities of the carbon substrate surface is formed. This makes it possible to obtain a tantalum carbide coating film which is not easily peeled off from a carbon substrate. Furthermore, the crystallinity of the tantalum carbide coating film is gradually improved by gradually increasing the production temperature in the crystal growth step. As a result, the crystallinity is developed at around the surface of the tantalum carbide coating film, and therefore a tantalum carbide coating film having a small number of grain boundaries as compared to the conventional cases is obtained.

In addition to the above, preferably, the tantalum carbide coating film has a maximum peak value of at least 80 degrees in an orientation angle of a (220) plane corresponding to a diffraction peak of the tantalum carbide as determined by the X-ray diffraction. On this account, mainly existing in the tantalum carbide coating film are crystal grains having the (220) planes that are in parallel to the surface of the carbon substrate which is a part of the tantalum carbide coating film. Because the growth of the crystal grains constituting the tantalum carbide coating film is facilitated, the number of grain boundaries in the tantalum carbide coating film is significantly reduced as compared to the conventional cases.

In addition to the above, preferably, the sum of intensities of diffraction lines corresponding to the (311) plane and the (220) plane in a X-ray diffraction pattern of the tantalum carbide coating film is not lower than 0.5 and not higher than 0.9 as compared to the sum total of the intensities of diffraction lines corresponding to all crystal planes of the tantalum carbide in the X-ray diffraction pattern of the tantalum carbide coating film. With this, a tantalum carbide coating film constituted by sufficiently-grown tantalum carbide crystal grains is obtained, and therefore the number of grain boundaries in the tantalum carbide coating film is significantly reduced as compared to the conventional cases.

In addition to the above, preferably, the intensity of the diffraction line corresponding to the (311) plane or the (220) plane in the X-ray diffraction pattern of the tantalum carbide coating film is the maximum. This makes it possible to reduce the number of grain boundaries of the tantalum carbide coating film as compared to the conventional cases.

In addition to the above, preferably, the half value width of the diffraction line of the (311) plane or the (220) plane in the X-ray diffraction pattern of the tantalum carbide coating film is not higher than 0.12 degrees. Because this results in the formation of the tantalum carbide coating film having high crystallinity and constituted by sufficiently grown tantalum carbide crystal grains, the number of grain boundaries in the tantalum carbide coating film is considerably reduced as compared to the conventional cases.

According to the present invention, a production method of a tantalum carbide-coated carbon material by forming a tantalum carbide coating film on a carbon substrate includes: a tantalum coating film formation process of forming a tantalum coating film on a surface of the carbon substrate; and a carburizing process of carburizing the tantalum coating film.

According to the present invention, a tantalum coating film is formed on the surface of a carbon substrate and this tantalum coating film is transformed to a tantalum carbide coating film. This significantly reduces the number of grain boundaries in the tantalum carbide as compared to the conventional cases Furthermore, because the tantalum coating film is formed first on the carbon substrate, the tantalum coating film is softened under a high temperature environment, with the result that the tantalum carbide coating film fits to the irregularities on the surface of the carbon substrate. A tantalum carbide-coated carbon material having a fine-grained high-strength tantalum carbide coating film and closely contacting the carbon substrate is obtained.

In addition to the above, preferably, the tantalum coating film formation process and the carburizing process are repeated in this order plural times. This makes it possible to easily change the thickness of the tantalum carbide coating film.

In addition to the above, preferably, the tantalum coating film formation process is repeated plural times. With this, the thickness of the tantalum coating film is changeable In addition to the above, preferably, in the carburizing process, the carburizing is carried out at temperatures of 1700 degrees Celsius to 2500 degrees Celsius. With this, a tantalum carbide-coated carbon material which is not easily worn under high-temperature environments is obtained.

In addition to the above, preferably, a thermal expansion coefficient of the carbon substrate is 6.5-8.0×10$^{-6}$/K. With this, the thermal expansion coefficient of the carbon substrate is close to the thermal expansion coefficient of the tantalum carbide, and hence a thermal stress applied to the tantalum carbide coating film is reduced. It is therefore possible to obtain a tantalum carbide-coated carbon material having a tantalum carbide coating film which is not easily peeled off from a carbon substrate.

In addition to the above, preferably, the tantalum coating process is carried out while supporting a coating object by a support, and an uncoated part formed by the support in an initial tantalum coating film formation process is coated in a second or subsequent tantalum coating film formation process. With this, the tantalum carbide coating film is formed on the entire surface of the carbon substrate.

According to the present invention, a production method of forming a tantalum carbide-coated carbon material by forming a tantalum carbide coating film on a carbon substrate through a tantalum carbide coating film formation process includes: a first tantalum carbide coating film formation process of forming a first tantalum carbide coating film through a tantalum coating film formation process of forming a tantalum coating film on a surface of the carbon substrate and a carburizing process of carburizing the tantalum coating film; and a second tantalum carbide coating film formation process of forming a new second tantalum carbide coating film on the first tantalum carbide coating film.

With this, a tantalum coating film is formed on the surface of a carbon substrate, a first tantalum carbide coating film is formed by transforming the tantalum coating film into a tantalum carbide coating film, and a second tantalum carbide coating film is formed on the first tantalum carbide coating film. In this way, a tantalum carbide coating film succeeding to the crystal orientation of the first tantalum carbide coating film is easily formed, and the number of grain boundaries is significantly reduced in the tantalum carbide-coated carbon material as compared to the conventional cases. As a result, a tantalum carbide-coated carbon material having a fine-grained high-strength tantalum carbide coating film is obtained. Furthermore, by differentiating the production method of the second tantalum carbide coating film from the production method of the first tantalum carbide coating film, only the tantalum carbide coating film formation process is required as a production process of the first tantalum carbide coating film, which requires the tantalum coating film formation process and the carburizing process.

In addition to the above, preferably, in the carburizing process, the carburizing of the tantalum film is carried out at temperatures of 1700 degrees Celsius to 2500 degrees Celsius. With this, a tantalum carbide-coated carbon material which is not easily worn under high-temperature environments is obtained.

In addition to the above, preferably, a thermal expansion coefficient of the carbon substrate is $6.5-8.0 \times 10^{-6}$/K. With this, the thermal expansion coefficient of the carbon substrate is close to the thermal expansion coefficient of the tantalum carbide, and hence a thermal stress applied to the tantalum carbide coating film is reduced. It is therefore possible to obtain a tantalum carbide-coated carbon material having a tantalum carbide coating film which is not easily peeled off from a carbon substrate.

In addition to the above, preferably, the tantalum carbide coating film has a maximum peak value of at least 80 degrees in an orientation angle of a (311) plane corresponding to a diffraction peak of tantalum carbide as determined by X-ray diffraction. With this, mainly existing in the tantalum carbide coating film are crystal grains having the (311) planes that are in parallel to the surface of the carbon substrate which is a part of the tantalum carbide coating film. This makes it possible to obtain a fine-grained high-strength tantalum carbide coating film in which the number of grain boundaries is small.

In addition to the above, preferably, the tantalum carbide coating film has a maximum peak value of at least 80 degrees in an orientation angle of a (220) plane corresponding to a diffraction peak of the tantalum carbide as determined by the X-ray diffraction. With this, mainly existing in the tantalum carbide coating film are crystal grains having the (220) planes that are in parallel to the surface of the carbon substrate which is a part of the tantalum carbide coating film. This makes it possible to obtain a fine-grained high-strength tantalum carbide coating film in which the number of grain boundaries is small.

In addition to the above, preferably, the sum of diffraction intensities of the (311) plane and the (220) plane in a X-ray diffraction pattern of the tantalum carbide coating film is not lower than 0.5 and not higher than 0.9 as compared to the sum total of the intensities of diffraction lines corresponding to all crystal planes of the tantalum carbide in the X-ray diffraction pattern of the tantalum carbide coating film. With this, a tantalum carbide coating film constituted by sufficiently-grown tantalum carbide crystal grains is obtained, and therefore a fine-grained high-strength tantalum carbide film in which the number of grain boundaries is small is obtained.

In addition to the above, preferably, the intensity of the diffraction line of the (311) plane in the X-ray diffraction pattern of the tantalum carbide coating film is the maximum. With this, a fine-grained high-strength tantalum carbide film in which the number of grain boundaries is small is obtained.

In addition to the above, preferably, the half value width of the diffraction line of the (311) plane in the X-ray diffraction pattern of the tantalum carbide coating film is not higher than 0.12 degrees. With this, a tantalum carbide coating film constituted by sufficiently-grown tantalum carbide crystal grains is obtained, and therefore a fine-grained high-strength tantalum carbide film in which the number of grain boundaries is small is obtained.

Advantageous Effects of Invention

In the tantalum carbide-coated carbon material of the present invention, because the tantalum carbide coating film has a maximum peak value of at least 80 degrees in the orientation angle of the (311) plane corresponding to a diffraction peak of the tantalum carbide as determined by X-ray diffraction, mainly existing in the tantalum carbide coating film are crystal grains having the (311) planes that are in parallel to the surface of the carbon substrate which is a part of the tantalum carbide coating film. Because this results in the tantalum carbide coating film constituted by sufficiently grown tantalum carbide crystal grains, the number of grain boundaries in the tantalum carbide coating film is considerably reduced as compared to conventional cases. A fine-grained high-strength tantalum carbide coating film is therefore obtained, and the life of the tantalum carbide-coated carbon material is extended.

According to the production method of the tantalum carbide-coated carbon material of the present invention including the crystalline nucleus formation step and the crystal growth step, tantalum carbide crystalline nuclei are formed in the concaves of the carbon substrate surface, and the crystallinity of the tantalum carbide coating film is gradually improved by gradually increasing the production temperature in the crystal growth step. Because this makes it possible to form a tantalum carbide coating film fitting to the irregularities of the carbon substrate surface, the tantalum carbide coating film is not easily peeled off from the carbon substrate, and the number of grain boundaries is small in the tantalum carbide coating film as compared to the conventional cases because the crystallinity is improved around the outer surface of the tantalum carbide coating film.

In addition to the above, according to the production method of the tantalum carbide-coated carbon material of the present invention including the first formation process and the second formation process, the number of grain boundaries in the tantalum carbide coating film formed in the tantalum carbide coating film formation process is significantly small as compared to the conventional cases, and no impurities are released from the tantalum carbide coating film at the time of the formation of a new tantalum carbide coating film. Therefore no impurity gas is trapped between the base tantalum carbide coating film and the new tantalum carbide coating film. Furthermore, the crystallinity of the base tantalum carbide coating film rarely changes at the time of the formation of the new tantalum carbide coating film, and hence the crystallinity of the base film is substantially identical with the crystallinity of the new tantalum carbide coating film. The base tantalum carbide coating film and the tantalum carbide coating film therefore closely contact each other because of the substantially no difference in the crystallinity.

In addition to the above, according to the production method of the tantalum carbide-coated carbon material of the present invention including the tantalum coating film formation process and the carburizing process, by forming a tantalum coating film on the surface of a carbon substrate and transforming this tantalum coating film into a tantalum carbide coating film, the number of grain boundaries in the tantalum carbide is significantly reduced as compared to the conventional cases. Furthermore, because the tantalum coating film is formed first on the carbon substrate, the tantalum coating film is softened under a high temperature environment, with the result that the tantalum carbide coating film fits to the irregularities on the surface of the carbon substrate. A tantalum carbide-coated carbon material having a fine-grained high-strength tantalum carbide coating film and closely contacting the carbon substrate is obtained.

In addition to the above, according to the production method of the tantalum carbide-coated carbon material of the present invention including the first tantalum carbide coating film formation process and the second tantalum carbide coating film formation process, a tantalum coating film is formed on the surface of a carbon substrate, a first tantalum carbide coating film is formed by transforming the tantalum coating film into a tantalum carbide coating film, and a second tantalum carbide coating film is formed on the first tantalum carbide coating film. In this way, a tantalum carbide coating film succeeding to the crystal orientation of the first tantalum carbide coating film is easily formed, and the number of grain boundaries is significantly reduced in the tantalum carbide-coated carbon material as compared to the conventional cases. As a result, a tantalum carbide-coated carbon material having a fine-grained high-strength tantalum carbide coating film is obtained. Furthermore, by differentiating the production method of the second tantalum carbide coating film from the production method of the first tantalum carbide coating film, only the tantalum carbide coating film formation process is required as a production process of the first tantalum carbide coating film, which requires the tantalum coating film formation process and the carburizing process

BRIEF DESCRIPTION OF DRAWINGS

[FIG. 13] shows results of Examples 7 and 8.
[FIG. 25] shows a result of Comparative Example 1.

DESCRIPTION OF EMBODIMENTS

The following will describe a preferred embodiment of the present invention with reference to figures.

The present embodiment deals with a production method of a tantalum carbide-coated carbon material first, and then deals with a tantalum carbide-coated carbon material produced by the method.

[Production Method of Tantalum Carbide-Coated Carbon Material]

(Formation Method (1) of Tantalum Carbide Coating Film by CVD Treatment)

The following describes a formation process of a tantalum carbide coating film by CVD treatment. In the present embodiment, the method uses an apparatus shown in FIG. 1. The formation method of the tantalum carbide coating film is not limited to CVD. Conversion (CVR), thermal spraying, or physical vapor deposition (PVD) may be used instead of CVD. First, a high-frequency induction heater shown in FIG. 1 will be described.

<High-Frequency Induction Heater>

Figure 1:
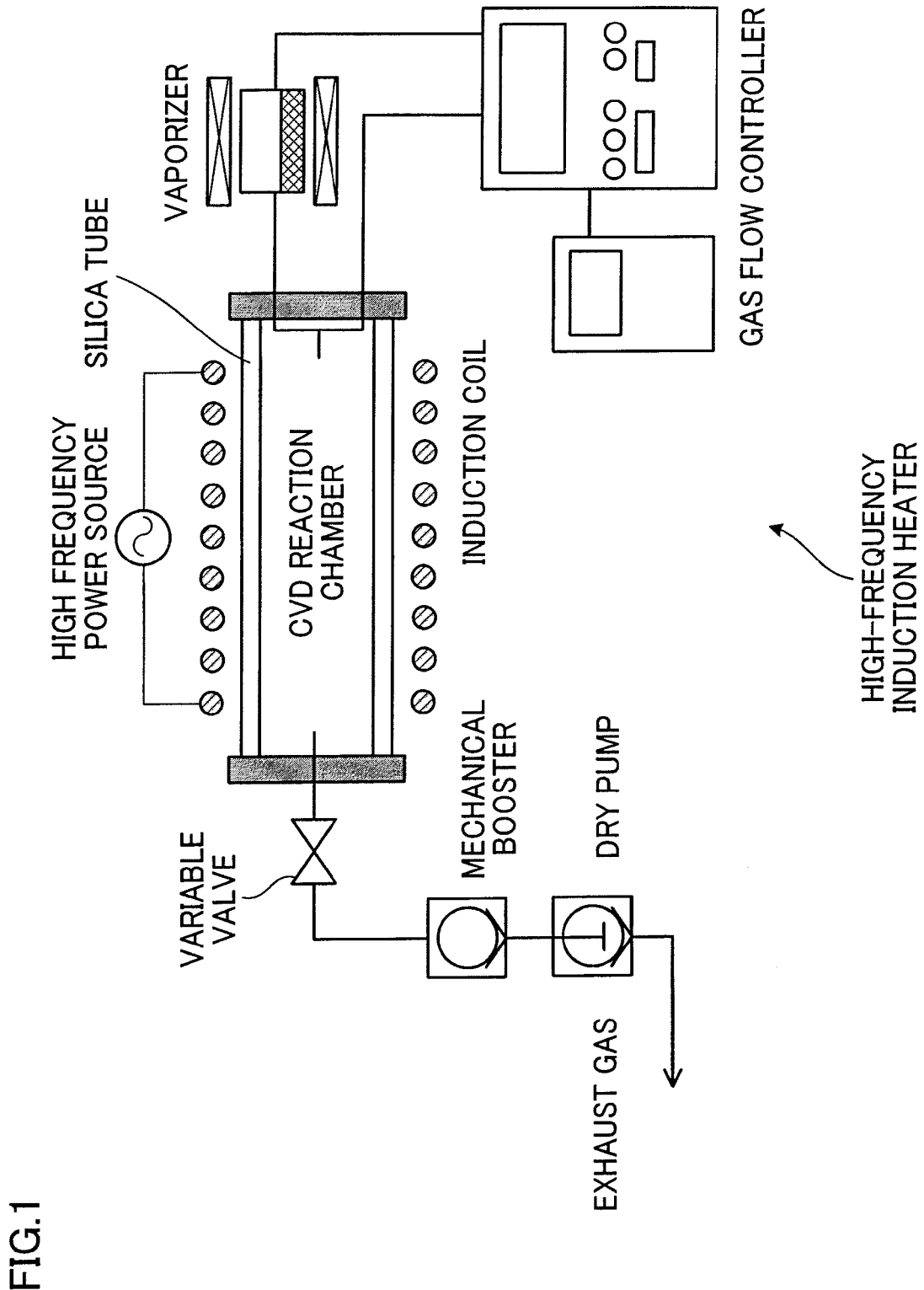
[FIG. 1] outlines a high-frequency induction heater.

As shown in FIG. 1, the high-frequency induction heater has a CVD reaction chamber. The CVD reaction chamber indicates an internal space formed by walls of a graphite furnace (not illustrated) which is wrapped up by an insulating material (not illustrated), functions as a, inductive load, and is provided inside a duplex silica tube. Outside the silica tube is provided a heater having a high frequency coil (induction coil). The space in the CVD reaction chamber is heated by the high frequency coil. At one end of the CVD reaction chamber is provided a gas introduction tube through which material gas is introduced. At the other end of the CVD reaction chamber is formed an exhaust port. This exhaust port is connected to an exhaust pipe through which gas in the CVD reaction chamber is exhausted. The exhaust pipe is provided with a variable valve at a part which is close to the exhaust port. The pressure inside the CVD reaction chamber is adjustable by the variable valve. On the upstream of the CVD reaction chamber is provided a gas flow controller. The gas flow of material gas introduced into the CVD reaction chamber is adjusted by the gas flow controller.

Figure 2:
[FIG. 2] shows how a tantalum carbide coating film is formed.
Figure 2:
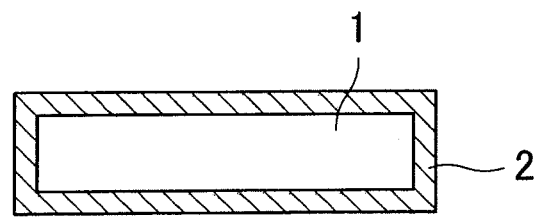

Now, referring to FIG. 2, a method of producing a tantalum carbide coating film by using the high-frequency induction heater shown in FIG. 1 will be described.

<Pretreatment in Formation Method of Tantalum Carbide Coating Film>

First, the pressure in the CVD reaction chamber is reduced and then degassing and CVD treatment are carried out in this order. One or more carbon substrate 1 is provided in the CVD reaction chamber (see FIG. 2(a)), and the pressure in the CVD reaction chamber is reduced to about 0.1-0.01 Torr (13.33 Pa-1.333 Pa). Thereafter, degassing is carried out by heating the internal space of the CVD reaction chamber. More specifically, after hydrogen gas is introduced at 7000 cc/min into the CVD reaction chamber, the internal space of the CVD reaction chamber is heated to about 1100 degrees Celsius. Degassing of the CVD reaction chamber is carried out in this way.

<Formation of Tantalum Carbide Coating Film>

Now, a formation process of the tantalum carbide coating film by CVD treatment will be described. The internal space of the CVD reaction chamber shown in FIG. 1 is kept at 850-1100 degrees Celsius, and the pressure of the internal space is reduced to 10 Torr (1333 Pa) or lower by operating the variable valve. Thereafter, as material gas, halogen compounds of tantalum such as tantalum pentachloride ($TaCl_5$) and hydrocarbon gas such as methane ($CH_4$) are introduced into the CVD reaction chamber. Furthermore, as carrier gas, for example, argon gas, hydrogen gas, or a mixture thereof is supplied.

The purity of the argon gas and hydrogen gas is preferably 99.99% or greater and the oxygen content is preferably not higher than 5 ppm. Under the conditions above, a tantalum carbide coating film 2 is formed on the surface of the carbon substrate (see FIG. 2(b)). In this connection, the C/Ta ratio in the tantalum carbide coating film 2 preferably falls within the range of 1.0-2.0. Furthermore, the carbon source of the material gas supplied to the CVD reaction chamber is preferably 2 to 25 times larger than the tantalum source.

When both argon gas and hydrogen gas are supplied, the reaction expressed by the reaction formula (1) below occurs on account of thermal decomposition reaction of a mixed gas of tantalum pentachloride, methane gas, and hydrogen gas. The tantalum carbide generated by this reaction is deposited on the surface of the carbon material, with the result that the tantalum carbide coating film is formed.

[Formula 1]

$$2TaCl_5 + 2CH_4 + H_2 \rightarrow 2TaC + 10HCl \quad (1)$$

Note that, in the case of hydrocarbon, the smaller the molecular weight is, the larger the activation energy is and the higher the reaction temperature is.

For this reason, for CVD treatment at about 850 degrees Celsius or higher, methane $CH_4$ or ethane $C_2H_6$ is suitable.

While the reaction of the reaction formula (1) progresses, impurities exist at the grain boundaries of the tantalum carbide coating film. When the material is chloride, the impurities are predominantly chloride impurities. In this regard, the inventors recognize that the impurities (predominantly chloride impurities) are released from the tantalum carbide coating film when the temperature is about 850 degrees Celsius or higher. In the present embodiment, as described above, the CVD treatment (the process of forming the tantalum carbide coating film) is carried out at 850-1100 degrees Celsius. For this reason, the impurities are released from the coating film at the same time as the formation of the film. The impurity concentration in the tantalum carbide coating film is therefore reduced. With this, no impurities are released from the tantalum carbide coating film after the film formation. One can understand why no impurities are released from the tantalum carbide coating film after the film formation because no voids are formed on the surface of the tantalum carbide coating film after thermal treatment at 1600 degrees Celsius or higher.

Now, an improvement over the above-described formation method (1) of the tantalum carbide coating film by CVD treatment will be described.

(Formation Method (2) of Tantalum Carbide Coating Film by CVD Treatment)

This method is a production method of a tantalum carbide-coated carbon material by forming a tantalum carbide coating film on a carbon substrate, and includes a crystalline nucleus formation step of forming tantalum carbide crystalline nuclei on the surface of the carbon substrate and a crystal growth step for causing the crystal growth of the tantalum carbide crystalline nuclei after the crystalline nucleus formation step.

The crystal growth step includes a heating step of gradually increasing the production temperature (hereinafter, heating). The higher the CVD treatment temperature is, the larger the tantalum carbide crystal grains are and the fewer the grain boundaries of the tantalum carbide coating film are. However, when the CVD treatment is carried out at 950 degrees Celsius or higher, the crystal grains of the tantalum carbide coating film are larger than the diameters of pores on the surface of the carbon substrate. Furthermore, because the time interval between the crystalline nucleus formation to the nucleus growth is shortened as the CVD treatment temperature is increased, the crystal growth step progresses at the crystalline nuclei formed at protrusions on the carbon substrate surface but the crystalline nucleus formation does not occur at the concaves on the carbon substrate surface. This decreases the contact area between the tantalum carbide coating film and the carbon substrate, with the result that the degree of close contact is deteriorated. Furthermore, because the tantalum carbide coating film is not softened at high temperatures like tantalum coating films so as to fit to the irregularities on the carbon substrate surface, the contact area cannot be increased by a thermal treatment.

In the meanwhile, when the CVD treatment temperature is low, before the crystalline nuclei formed at the protrusions of the carbon substrate shift to the crystal growth step, sufficient crystalline nuclei are formed at the concaves of the carbon substrate surface and the crystal growth thereof is achieved. It is therefore possible in this case to obtain a tantalum carbide-coated carbon material having a high degree of close contact. For the reason above, the method is arranged so that, after the formation of tantalum carbide crystalline nuclei at the inside of concaves and at protrusions on the surface of the carbon substrate by CVD treatment at a temperature lower than 950 degrees Celsius, preferably lower than 930 degrees Celsius (crystalline nucleus formation step), the crystal growth of the crystalline nuclei is promoted (crystal growth step) by gradually increasing the CVD treatment temperature (heating step). In this connection, in the crystalline nucleus formation step, the temperature at which the tantalum carbide crystalline nuclei are formed is preferably at 850-950 degrees Celsius. This makes it possible to form sufficient tantalum carbide crystalline nuclei inside the concaves of the carbon substrate surface, with the result that a tantalum carbide coating film fitting to the irregularities on the surface of the carbon substrate is obtained.

In addition to the above, the production temperature is preferably unchanged after the heating step. This makes it possible to deposit a tantalum carbide coating film having grown crystal grains, and therefore a tantalum carbide coating film including fewer grain boundaries and having a desired thickness as compared to conventional cases is obtained. As such, a tantalum carbide coating film having a desired thickness is obtained such that the treatment temperature is kept at 950 degrees Celsius or higher after the production temperature is increased. In addition to the above, in the heating step, preferably the production temperature is gradually increased for 50 degrees Celsius or more, and more preferably for 100 degrees Celsius or more. With this, a tantalum carbide coating film fitting to the irregularities of the surface of the carbon substrate is obtained at around the surface of the carbon substrate, whereas a tantalum carbide coating film with grown crystal grains and a small number of grain boundaries is obtained at around the outer surface of the tantalum carbide coating film. In addition to the above, it is preferable in the heating step to increase the production temperature at a constant rate. This prevents the obstruction to crystal grain growth in the tantalum carbide coating film on account of rapid change of crystallinity. Because a tantalum carbide coating film fitting to the irregularities on the surface of the carbon substrate is obtained by the arrangement above, the degree of close contact between the tantalum carbide coating film and the carbon substrate is improved.

The crystal grains grown by the method above gradually increase in size from around the carbon substrate surface toward the outer surface of the tantalum carbide coating film. The crystal grains are considered to be polygonal in shape. This is achieved by gradually improving the crystallinity of the tantalum carbide coating film by the gradual increase in the temperature in the furnace in CVD treatment.

The heating step of gradually increasing the temperature in the furnace is preferably stopped when the thickness of the tantalum carbide coating film reaches 5 μm, more preferably when the thickness is 3 μm or less from starting the crystalline nucleus. When the heating is too rapidly done, crystalline nuclei are not sufficiently formed at the concaves of the surface of the carbon substrate, with the result that the improvement in the close contact of the tantalum carbide coating film is not achieved. On the other hand, when the heating is too slowly done, the number of grain boundaries is large in the coating film.

Now, an improvement of the above-described formation methods (1) and (2) of the tantalum carbide coating film by CVD treatment will be described.

(Formation Method (3) of Tantalum Carbide Coating Film by CVD Treatment)

According to this method, a tantalum carbide-coated carbon material with multiple coating is formed by conducting the above-described formation method (1) of the tantalum carbide coating film by CVD treatment twice or more. The method includes a first formation process of forming a first tantalum carbide coating film on the surface of a carbon substrate and a second formation process of forming a new tantalum carbide coating film once or more on the first tantalum carbide coating film. In the method using CVD treatment, because the formation of a tantalum carbide coating film is carried out while a carbon substrate is supported by a jig (support), no tantalum carbide coating film is formed at a contact surface between the carbon substrate and the jig. For this reason, the position of the support is changed so that the uncoated part formed in the initial tantalum carbide coating film formation process due to the support is coated in the second or subsequent tantalum carbide coating film formation process. This makes it possible to coat the entire surface of the carbon substrate by the tantalum carbide coating film.

Figure 3:
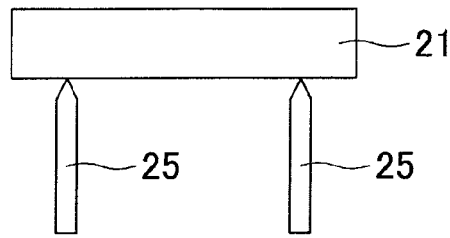
[FIG. 3] shows how a tantalum carbide coating film is formed.
Figure 3:
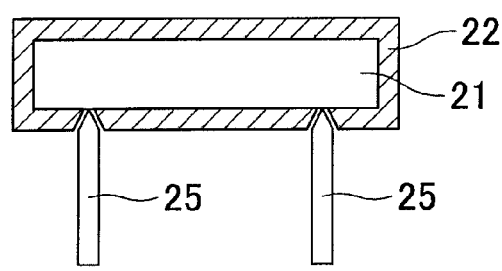
Figure 3:
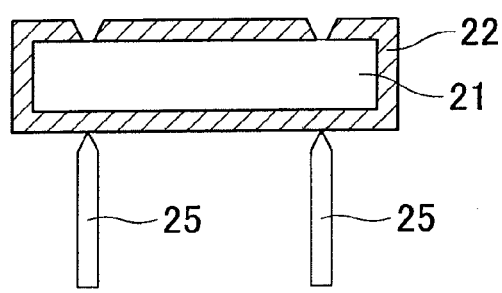
Figure 3:
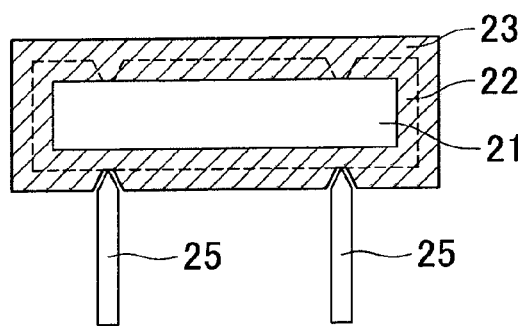

More specifically, as shown in FIG. 3(a), the carbon substrate 21 is provided in an unillustrated reaction chamber while being supported from below by a supporting rod 25 (jig). Thereafter, the carbon substrate 21 is subjected to the CVD treatment so that a first tantalum carbide coating film 22 is formed on the surface of the carbon substrate 21 (first film formation process in FIG. 3(b)). At this stage, no tantalum carbide coating film 22 is formed at the contact surface between the carbon substrate 21 and the supporting rod 25.

Subsequently, as shown in FIG. 3(c), the position at which the supporting rod 25 supports the carbon substrate 21 is changed to a part having the tantalum carbide coating film 22 thereon. Then the CVD treatment is carried out under the same conditions as the first film formation process, with the result that the second tantalum carbide coating film 23 is formed on the surface of the tantalum carbide coating film 22 as shown in FIG. 3(d) (second film formation process). With this, the tantalum carbide coating film 23 is formed on the surface of the tantalum carbide coating film 22, with the result that the tantalum carbide coating film is formed on the entire surface of the carbon substrate 21.

In this regard, the tantalum carbide coating film 22 preferably has a maximum peak value of at least 80 degrees in the orientation angle of the (311) plane corresponding to a diffraction peak of the tantalum carbide as determined by X-ray diffraction. Furthermore, the half value width of the diffraction line of the (311) plane is preferably not higher than 0.12 degrees. When a new tantalum carbide coating film is formed on the above-described tantalum carbide coating film, the crystal growth in the new tantalum carbide coating film 23 succeeds to that of the crystal grains in the tantalum carbide coating film 22 which is the base, with the result that the tantalum carbide coating film 22 and the tantalum carbide coating film 23 form a non-individual body. This prevents the new tantalum carbide coating film 23 from being peeled off from the base tantalum carbide coating film 22. Furthermore, because the number of grain boundaries in the tantalum carbide coating film 22 is significantly small as compared to conventional cases, no impurities are released from the tantalum carbide coating films 22 and 23 formed in the respective tantalum carbide coating film formation processes. For this reason, no impurity gas is trapped between the base tantalum carbide coating film 22 and the new tantalum carbide coating film 23. Furthermore, the crystallinity of the base tantalum carbide coating film 22 rarely changes at the time of the formation of the new tantalum carbide coating film (i.e., at the time of the CVD treatment), and hence the crystallinity of the base film 22 is substantially identical with the crystallinity of the new tantalum carbide coating film 23. The base tantalum carbide coating film 22 and the tantalum carbide coating film 23 therefore closely contact each other because of the substantially no difference in the crystallinity.

On the other hand, when a new tantalum carbide coating film is formed by CVD treatment on a tantalum carbide coating film which does not have the arrangement above, impurities are released from the base tantalum carbide coating film during the CVD treatment, with the result that impurity gas may be trapped between the new tantalum carbide coating film and the base tantalum carbide coating film. In the formation of the new tantalum carbide coating film (i.e., at the time of CVD treatment), the crystallinity of the base tantalum carbide coating film is improved and a difference between this crystallinity and the crystallinity of the tantalum carbide coating film becomes significant. This causes a problem of peeling off of the new tantalum carbide coating film.

In addition to the above, the tantalum carbide coating film 22 preferably has the following characteristics in order to improve the degree of close contact of the tantalum carbide coating films 22 and 23. That is to say, the tantalum carbide coating film 22 preferably has a maximum peak value of at least 80 degrees in the orientation angle of the (220) plane corresponding to a diffraction peak of the tantalum carbide as determined by X-ray diffraction. Because in this case the number of grain boundaries in the tantalum carbide coating film formed in each tantalum carbide coating film formation process is significantly small as compared to conventional cases, no impurities are released from the tantalum carbide coating film 22. Furthermore, the sum of the intensities of the diffraction lines corresponding to the (311) plane and the (220) plane in the X-ray diffraction pattern of the tantalum carbide coating film 22 is preferably not lower than 0.5 and not higher than 0.9 as compared to the sum total of the intensities of the diffraction lines corresponding to all crystal planes of the tantalum carbide in the X-ray diffraction pattern of the tantalum carbide coating film 22. Because this results in the tantalum carbide coating film 22 constituted by sufficiently grown tantalum carbide crystal grains, the number of grain boundaries in the tantalum carbide coating film 23 is considerably reduced as compared to conventional cases. In addition to the above, the intensity of the diffraction line corresponding to the (311) plane or the (220) plane in the X-ray diffraction pattern of the tantalum carbide coating film 22 is preferably maximized. This makes it possible to reduce the number of grain boundaries of the tantalum carbide coating film 22 as compared to the conventional cases. Furthermore, the half value width of the diffraction line of the (311) plane or the (220) plane in the X-ray diffraction pattern of the tantalum carbide coating film is preferably not higher than 0.12 degrees. Because this results in the tantalum carbide coating film 22 having high crystallinity and constituted by sufficiently grown tantalum carbide crystal grains, the number of grain boundaries in the tantalum carbide coating film 23 is considerably reduced as compared to the conventional cases.

It is noted that, in the formation of a tantalum carbide coating film by CVD, it is possible to change the speed of the growth of the coating film, the crystallinity, thickness, the sizes of crystal grains constituting the coating film, and the orientation of the crystals, by changing the CVD conditions such as a temperature, a pressure, each gas flow, and a processing time or by suitably combining these conditions. The CVD treatment conditions may be arbitrarily changed by a person skilled in the art, and such changes do not restrict the present invention.

Now, a formation method of a tantalum carbide coating film, which is different from the above-described formation method of the tantalum carbide coating film by CVD treatment, will be described.

Figure 4:
[FIG. 4] shows how a tantalum carbide coating film is formed.
Figure 4:
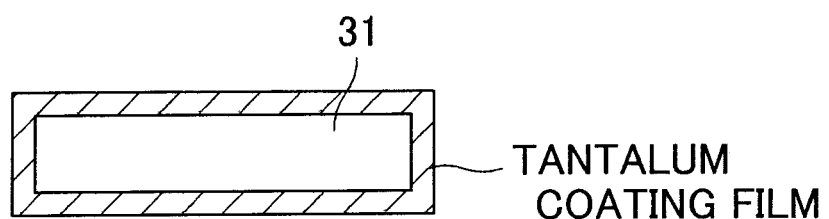
Figure 4:
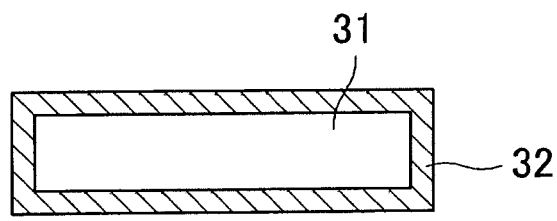

(Formation Method (4) of Tantalum Carbide Coating Film)
This method includes a tantalum coating film formation method of forming a tantalum coating film on a carbon substrate and a carburizing process for carburizing the tantalum coating film. The method will be detailed below with reference to FIG. 4. First, a carbon substrate 31 shown in FIG. 4(*a*) is provided. Then, as shown in FIG. 4(*b*), a tantalum coating film is formed on the surface of the carbon substrate 31 (tantalum coating film formation process). Then the tantalum coating film is carburized (carburizing process). As a result, as shown in FIG. 4(*c*), the tantalum coating film is transformed to the tantalum carbide coating film 32.

Now, the tantalum coating film formation process and the carburizing process above will be detailed.
(Tantalum Coating Film Formation Process)
The formation of the tantalum coating film is carried out by, for example, chemical vapor deposition (CVD) using an apparatus shown in FIG. 1. The tantalum source is, for example, halogen compounds of tantalum such as tantalum pentachloride ($TaCl_5$). Described below is chemical vapor deposition (CVD) using a high-frequency induction heater shown in FIG. 1. It is noted that the formation method of the tantalum coating film is not limited to CVD. Conversion (CVD), thermal spraying, or physical vapor deposition (PVD) may be used instead of CVD. It is also noted that the method of using the apparatus shown in FIG. 1 may not be fully explained below for avoiding redundancy.
<Pretreatment in Formation Method of Tantalum Coating Film>
One or more carbon substrate 1 is provided in a CVD reaction chamber (see FIG. 4(*a*)), and the pressure in the CVD reaction chamber is reduced to about 0.1-0.01 Torr (13.33 Pa-1.333 Pa). Then degassing is carried out by heating the internal space of the CVD reaction chamber. More specifically, after introducing hydrogen gas at 7000 cc/min into the CVD reaction chamber, the internal space of the CVD reaction chamber is heated to about 1100 degrees Celsius. The degassing of the CVD reaction chamber is carried out in this way.
<Formation Method of Tantalum Coating Film Using High-Frequency Induction Heater>
Now, a formation process of a tantalum coating film by CVD treatment will be described. The pressure in the CVD reaction chamber is reduced to 10 Torr (1333 Pa) or lower by keeping the temperature in the CVD reaction chamber to be about 800 degrees Celsius or higher and operating the variable valve. Thereafter, as material gas, a tantalum halogen compound such as tantalum pentachloride ($TaCl_5$) is introduced into the CVD reaction chamber at a flow rate of 10-20 sccm. Furthermore, as carrier gas, argon gas, hydrogen gas, or a mixture thereof is introduced, for example. It is noted that the unit [sccm] indicates an amount ($cm^3$) of gas flowing in a minute under standard conditions. Under the conditions above, a tantalum coating film is formed on the surface of the carbon substrate 1 (see FIG. 4(*b*)).

It is noted that, in the formation of a tantalum coating film by CVD, it is possible to change the speed of the growth of the coating film, the crystallinity, thickness, the sizes of crystal grains constituting the coating film, and the orientation of the crystals, by changing the CVD conditions such as a temperature, a pressure, each gas flow, and a processing time or by suitably combining the conditions. The CVD treatment conditions may be arbitrarily changed by a person skilled in the art, and such changes do not restrict the present invention.
(Tantalum Coating Film)
The tantalum coating film obtained by the method above is constituted by tantalum crystal grains. The tantalum coating film has diffraction peaks corresponding to the (100) plane, the (200) plane, the (211) plane, and the (220) plane of tantalum crystals in the X-ray diffraction. Furthermore, the diffraction peak of the (200) plane exhibits the maximum diffraction intensity, whereas the half value width of this (200) plane is 0.2 degrees or lower. When a thermal expansion coefficient of the carbon substrate 31 is $6.5 \times 10^{-6}$-$8.0 \times 10^{-6}$/K, the carbon substrate 31 and the tantalum coating film have different thermal expansion coefficients. In this connection, because the tantalum coating film has an internal stress, peak shift and peak splitting are observed in the X-ray diffraction pattern.

The tantalum coating film is softened at about a temperature of 1100 degrees Celsius or higher, and fits to the shape of the irregularities on the carbon substrate 31. This allows the tantalum coating film to enter the pores on the surface of the carbon substrate 31, with the result that the degree of close contact between the carbon substrate 31 and the tantalum coating film is improved.

Now, a carburizing process of carburizing the tantalum coating film formed by the method above will be described.
(Carburizing of Tantalum Coating Film)
In an unillustrated carburizing furnace, a carbon substrate 31 having a tantalum coating film thereon is provided (FIG. 4(*b*)). In the carburizing, the temperature in the carburizing furnace is kept at 1700-2500 degrees Celsius and the pressure in the carburizing furnace is adjusted to $10^{-2}$-10 Pa. As the carbon source for the carburizing, a graphite material for carbon source, which is provided in advance, or carbon included in a graphite jig in the carburizing furnace is used. Because of the presence of such carbon, the tantalum coating film is transformed to a tantalum carbide coating film (FIG. 4(*c*)).

According to the method, a tantalum coating film whose shape fits to the irregularities on the surface of the carbon substrate 1 is carburized. As a result, a tantalum carbide coating film which closely contacts the carbon substrate and is not easily worn in a hot environment is obtained.

Note that, by repeating the tantalum coating film formation process and the carburizing process in this order plural times according to the method (4), it is possible to easily change the thickness of the tantalum carbide coating film. Furthermore, it is possible to change the thickness of the tantalum coating film by repeating the tantalum coating film formation process plural times before the carburizing process. When the tantalum coating film formation process and the carburizing process are repeated plural times in this order and when the tantalum coating film formation process is repeated plural times, the tantalum coating process is carried out while the coating object is supported by a support. In this connection, the position of the support is changed so that the uncoated part formed in the initial tantalum coating film formation process due to the support is coated in the second or subsequent tantalum coating film formation process. With this, the tantalum carbide coating film is formed on the entire surface of the carbon substrate.

Now a method using the above-described formation method (4) of the tantalum carbide coating film and the above-described production method of the tantalum carbide coating film by CVD treatment will be described.

(Formation Method (5) of Tantalum Carbide Coating Film)

In the tantalum carbide coating film obtained by the above-described formation method (4) of the tantalum carbide coating film, the diffraction line of the (311) plane of the tantalum carbide exhibits the maximum diffraction intensity in the X-ray diffraction pattern. In the tantalum carbide coating film obtained by the CVD treatment, the diffraction line of the (311) plane or the (220) plane of the tantalum carbide exhibits the maximum diffraction intensity in the X-ray diffraction pattern.

As a result of diligent study, the inventors of the present invention have found that, when a new tantalum carbide coating film is formed on a tantalum carbide coating film, the new film succeeds to the crystal orientation of the base tantalum carbide coating film. This holds true for the crystal orientation of a tantalum carbide coating film produced by a different production process. This characteristic makes it possible to perform multiple coating of forming, for example, a carburized tantalum carbide coating film on a tantalum carbide coating film produced by CVD treatment. In this connection, the tantalum carbide coating film is preferably arranged so that the diffraction line of the (311) plane of the tantalum carbide is the maximum in the X-ray diffraction pattern. The reason of this will be described later. Therefore, the tantalum carbide coating film obtained by the above-described tantalum carbide coating film formation method (4) in which the diffraction line of the (311) plane is the maximum is preferably used as the first tantalum carbide coating film. On this first tantalum carbide coating film, for example, a tantalum carbide coating film is formed by CVD treatment. In this way, a multiple coating film in which the diffraction line of the (311) plane of the tantalum carbide exhibits the maximum diffraction intensity in the topmost X-ray diffraction pattern is easily obtained. Furthermore, it is possible to reduce the number of steps to obtain a multiple coating film as compared to the above-described case where the tantalum carbide coating film is repeatedly formed by the tantalum carbide coating film formation method (4). However, the half value width of the diffraction line of the (311) plane or the (220) plane in the X-ray diffraction pattern in each coating film is preferably 0.12 degrees or lower. As a result, multiple coating films in which at least two different tantalum carbide coating films are deposited in cross section are formed on a carbon substrate.

In addition to the above, the first tantalum carbide coating film preferably has a maximum peak value of at least 80 degrees in the orientation angle of the (311) plane corresponding to a diffraction peak of the tantalum carbide as determined by X-ray diffraction. Because of this, crystal grains having (311) planes which are in parallel to the carbon substrate surface constituting the first tantalum carbide coating film mainly exist. According to the above-described arrangement, by forming a new tantalum carbide coating film on a first tantalum carbide coating film, it is possible to obtain at least two tantalum carbide coating films in which the new film succeeds to the characteristic of the base film. As a result, two or more fine-grained high-strength tantalum carbide coating films each having a small number of grain boundaries are obtained. Furthermore, the first tantalum carbide coating film preferably has a maximum peak value of at least 80 degrees in the orientation angle of the (220) plane corresponding to a diffraction peak of the tantalum carbide as determined by X-ray diffraction. Because of this, crystal grains having (220) planes which are in parallel to the carbon substrate surface constituting the first tantalum carbide coating film mainly exist. According to the above-described arrangement, by forming a new tantalum carbide coating film on a first tantalum carbide coating film, it is possible to obtain at least two tantalum carbide coating films in which the new film succeeds to the characteristic of the base film. As a result, two or more fine-grained high-strength tantalum carbide coating films each having a small number of grain boundaries are obtained. Furthermore, the sum of the intensities of the diffraction lines corresponding to the (311) plane and the (220) plane in the X-ray diffraction pattern of the first tantalum carbide coating film is preferably not lower than 0.5 and not higher than 0.9 as compared to the sum total of the intensities of the diffraction lines of all crystal planes of the tantalum carbide in the X-ray diffraction pattern of the first tantalum carbide coating film. Because of this, the first tantalum carbide coating film is constituted by sufficiently grown tantalum carbide crystal grains. According to the above-described arrangement, by forming a new tantalum carbide coating film on a first tantalum carbide coating film, it is possible to obtain at least two tantalum carbide coating films in which the new film succeeds to the characteristic of the base film. As a result, two or more fine-grained rigid tantalum carbide coating films each having a small number of grain boundaries are obtained.

Now, a tantalum carbide-coated carbon material of the present invention produced by all of the methods above will be described. It is noted that the carbon substrate 41 corresponds to the carbon substrates 1, 21, and 31 above, whereas the tantalum carbide coating film 42 corresponds to the tantalum carbide coating films 2, 22, 23, and 32 above.

Figure 5:
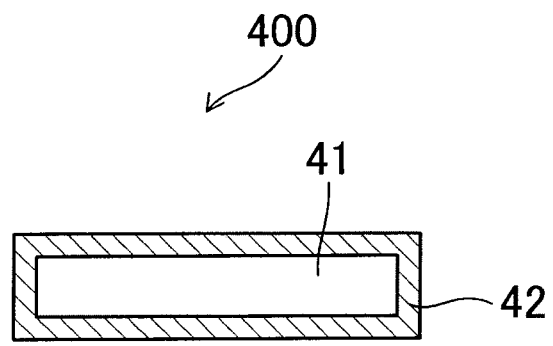
[FIG. 5] is a schematic cross section of a tantalum carbide-coated carbon material of the present invention.

As shown in FIG. 5, a tantalum carbide-coated carbon material 400 includes a carbon substrate 41 and a tantalum carbide coating film 42 formed on the carbon substrate 41.

(Tantalum Carbide Coating Film 42)

The tantalum carbide coating film 42 is constituted by tantalum carbide crystal grains. Note that, the tantalum carbide indicates a compound of tantalum atoms and carbon atoms, and is represented by, for example, a chemical formula of TaC or $Ta_2C$.

<Orientation of Crystal Plane>

The tantalum carbide coating film 42 has a maximum peak value of at least 80 degrees in the orientation angle of the (311) plane corresponding to a diffraction peak of the tantalum carbide as determined by X-ray diffraction. Furthermore, the tantalum carbide coating film 42 has a maximum peak value of at least 80 degrees in the orientation angle of the (220) plane corresponding to a diffraction peak of the tantalum carbide as determined by X-ray diffraction.

Figure 6:
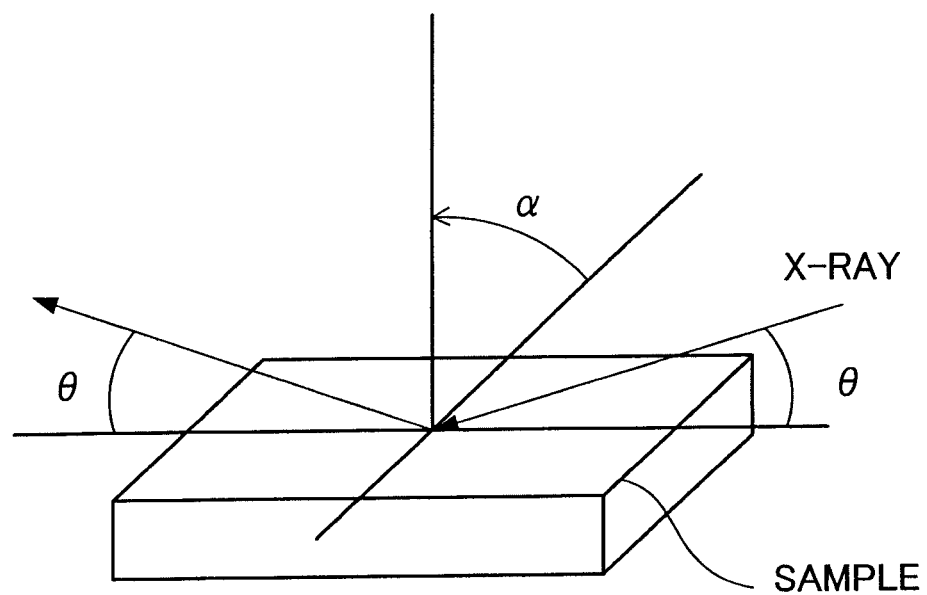
[FIG. 6] schematically shows a method of measuring an orientation angle of a crystal plane of tantalum carbide.

An orientation angle is measured by the method below. As shown in FIG. 6, X-ray is applied while rotating the tantalum carbide-coated carbon material 400, and the angles (orientation angles) at which the diffraction peaks of the (220) plane and the (311) plane of the tantalum carbide appear are measured. The results are shown in FIGS. 9, 12, 15, 19, 21, 24, and 26. In the graphs shown in FIGS. 9, 12, 15, 19, 21, 24, and 26, the horizontal axis indicates the orientation angle ($\alpha$) shown in FIG. 6. The vertical axis indicates the intensity.

Because the growth of the crystal grains is facilitated by arranging the crystals constituting the tantalum carbide coating film to be oriented as above, the number of the grain boundaries in the tantalum carbide coating film is significantly reduced. The reason of this will be described as below.

The crystal planes observed in the X-ray diffraction pattern of the tantalum carbide coating film are mainly (111) plane, (200) plane, (220) plane, (311) plane, (222) plane, and (400) plane. Among these crystal planes, the (111) plane is in parallel to the (222) plane and the (200) plane is in parallel to the (400) plane. For this reason, the discussion below deals with the relations of the (111) plane, the (200) plane, the (220) plane, and the (311) plane, among the crystal planes above.

Because tantalum carbide crystals are cubic crystals, plane indices(crystallographic planes) are always normal to directional indices(crystallographic direction). In the four planes of (111) plane, (200) plane, (220) plane, and (311) plane, angles between the planes are always 54.7 degrees between the (111) plane and the (200) plane, 35.3 degrees between the (111) plane and the (220) plane, 29.5 degrees between the (111) plane and the (311) plane, 45.0 degrees between the (200) plane and the (220) plane, 25.2 degrees between the (200) plane and the (311) plane, and 31.5 degrees between the (220) plane and the (311) plane. Provided that the directional index of a reference crystal plane is orthogonal to the carbon substrate surface, the angles formed by the reference crystal plane and other crystal planes are shown in Table 1.

TABLE 1

| | | REFERENTIAL CRYSTAL PLANE | | | |
|---|---|---|---|---|---|
| | | [311] | [220] | [111] | [200] |
| ANGLES FORMED | [311] | — | 31.5 | 29.5 | 25.2 |
| BY CRYSTAL | [220] | 31.5 | — | 35.3 | 45.0 |
| PLANES | [111] | 29.5 | 35.3 | — | 54.7 |
| (°) | [200] | 25.2 | 45.0 | 54.7 | — |

<Tantalum Carbide Coating Film Formed by Formation Method (4) of Tantalum Carbide Coating Film Having Tantalum Coating Film Formation Process and Carburizing Process>

The densities of tantalum and tantalum carbide are 16.65 g/cm$^3$ and 13.90 g/cm$^3$, respectively. Because of this, volume expansion occurs when the tantalum coating film is carburized and transformed to a tantalum carbide coating film, with the result that the lattice spacing of each crystal plane is widened. In this connection, it is assumed that, the more the directional index of each crystal plane gets close to the direction vertical to the carbon substrate surface, the smaller the internal stress of the tantalum carbide coating film becomes, and therefore the number of grain boundaries is reduced.

<Tantalum Carbide Coating Film Formed by Production Methods (1), (2), and (3) of Tantalum Carbide Coating Film by CVD Treatment>

In the tantalum carbide coating film formed by the method (1), (2), or (3), the tantalum carbide crystalline nuclei are formed and these crystalline nuclei are grown. The growth direction of each crystal plane of the tantalum carbide is in parallel to the directional index. The growth of the tantalum carbide crystal grains is obstructed as each grain collides the neighboring other crystal grains. It is assumed that, as the directional index of each crystal plane in the tantalum carbide crystal gets close to the vertical with respect to the carbon substrate surface, an internal stress generated by neighboring crystal grains becomes small as the growth is less obstructed. As a result, the crystal grains are developed and the number of grain boundaries is lowered.

Therefore, according to Table 1, it is preferable that the (220) plane of the tantalum carbide coating film 42 is predominantly in parallel to the carbon substrate surface and the (311) plane is predominantly in parallel to the surface of the carbon substrate 41. Furthermore, crystal grains in which the (311) planes are in parallel to the surface of the carbon substrate 41 and crystal grains in which the (220) planes are in parallel to the surface of the carbon substrate 41 may be mixed. This is understood from the fact that a difference between the (311) plane and the (220) plane in the maximum peak value of the orientation angle is not larger than 31.5 degrees. This makes it possible to form a fine-grained high-strength tantalum carbide coating film 42 in which the number of grain boundaries is small.

<X-Ray Diffraction Pattern of Tantalum Carbide Coating Film>

Preferably, one of the diffraction intensity corresponding to the (220) plane (hereinafter, I(220)) of the tantalum carbide and the diffraction intensity corresponding to the (311) plane (hereinafter, I(311)), which are calculated by the X-ray diffraction pattern of the tantalum carbide coating film 42, is maximum. The diffraction intensity in this case indicates a peak value that appears in response to a diffraction angle specific to each crystal plane. Furthermore, preferably, the sum of I(220) and I(311) falls within the range of not lower than 0.5 and not higher than 0.9 as compared to the total sum of the X-ray diffraction intensities of the respective crystal planes.

The total sum of the X-ray diffraction intensities of the respective crystal planes, which is represented as (I(111)+I(200)+I(220)+I(311)+I(222)+I(400)), is the total sum of the X-ray diffraction intensity (hereinafter, I(111)) calculated by the X-ray diffraction pattern and corresponding to the (111) plane, the X-ray diffraction intensity (hereinafter, I(200)) corresponding to the (200) plane, the X-ray diffraction intensity (hereinafter, I(220)) corresponding to the (220) plane, the X-ray diffraction intensity (hereinafter, I(311)) corresponding to the (311) plane, the X-ray diffraction intensity (hereinafter, I(222)) corresponding to the (222) plane, and the X-ray diffraction intensity (hereinafter, I(400)) corresponding to the (400) plane. Hereinafter, the total sum will be represented as Ip. Furthermore, the X-ray diffraction intensities and the total sum thereof are all compared based on integrated intensities.

When the sum of I(220) and I(311) of the tantalum carbide falls within the range of not lower than 0.5 and not higher than 0.9 with respect to the total sum Ip of the X-ray diffraction intensities corresponding to the respective crystal planes, the number of grain boundaries is small in the tantalum carbide coating film.

Note that, when the sum of I(220) and I(311) of the tantalum carbide is less than 0.5 with respect to the total sum Ip of the X-ray diffraction intensities corresponding to the respective crystal planes, it is considered that an internal stress generated by neighboring crystal grains is large, with the result that the growth of the crystal grains is obstructed and the number of grain boundaries is large. On the other hand, when the sum of I(220) and I(311) is higher than 0.9 with respect to the total sum Ip, it is considered that the growth of other crystal planes is insufficient in the tantalum carbide and the crystal grains in the tantalum carbide coating film are small.

In addition to the above, in the X-ray diffraction pattern of the tantalum carbide coating film 42, the full width at half maximum of the diffraction line of the (220) plane or the (311) plane of the tantalum carbide is preferably 0.2 degrees or lower, and more preferably 0.12 degrees or lower. The diffraction line of the (220) plane of the tantalum carbide appears at the diffraction angle of about 58.6 degrees, and the diffraction line of the (311) plane appears at the diffraction angle of about 70.0 degrees. The height of the diffraction intensity indicates the maximum peak height. The full width at half maximum of the diffraction line indicates the width of the peak at the intensity half as much as the intensity at the maximum height. This is used as an index of crystallinity.

As such, in all of the above-described formation methods (1)-(5) of the tantalum carbide coating film, the crystal grains significantly grow and the number of grain boundaries in the tantalum carbide coating film is small.

The X-ray diffraction pattern of the tantalum carbide coating film 42 can be measured by using, as an X-ray analyzer, Ulutima of Rigaku Corporation.

<Gas Permeability>

In the tantalum carbide coating film 42, the gas permeability is preferably not higher than $10^{-7}$ cm$^2$/s, and more preferably $10^{-8}$-$10^{-11}$ cm$^2$/sec. The tantalum carbide coating film 42 is fine-grained when the gas permeability falls within the range above. The carbon substrate typically has a nitrogen gas permeability of $10^{-2}$-$10^{-3}$ cm$^2$/sec. For this reason, when the nitrogen gas permeability of the tantalum carbide coating film 42 is not higher than $10^{-7}$ cm$^2$/s, the nitrogen gas permeability of the tantalum carbide coating film 42 is $10^{-5}$ to $10^{-4}$ times higher than the nitrogen gas permeability of the carbon substrate. When the tantalum carbide coating film is fine-grained, the film is heat resistant and gas etching resistant.

The nitrogen gas permeability of the tantalum carbide coating film 42 can be measured by, for example, an apparatus shown in FIG. 6. The following will describe a method of measuring the nitrogen gas permeability of a sample tantalum carbide coating film when the apparatus shown in FIG. 6 is used.

Figure 7:
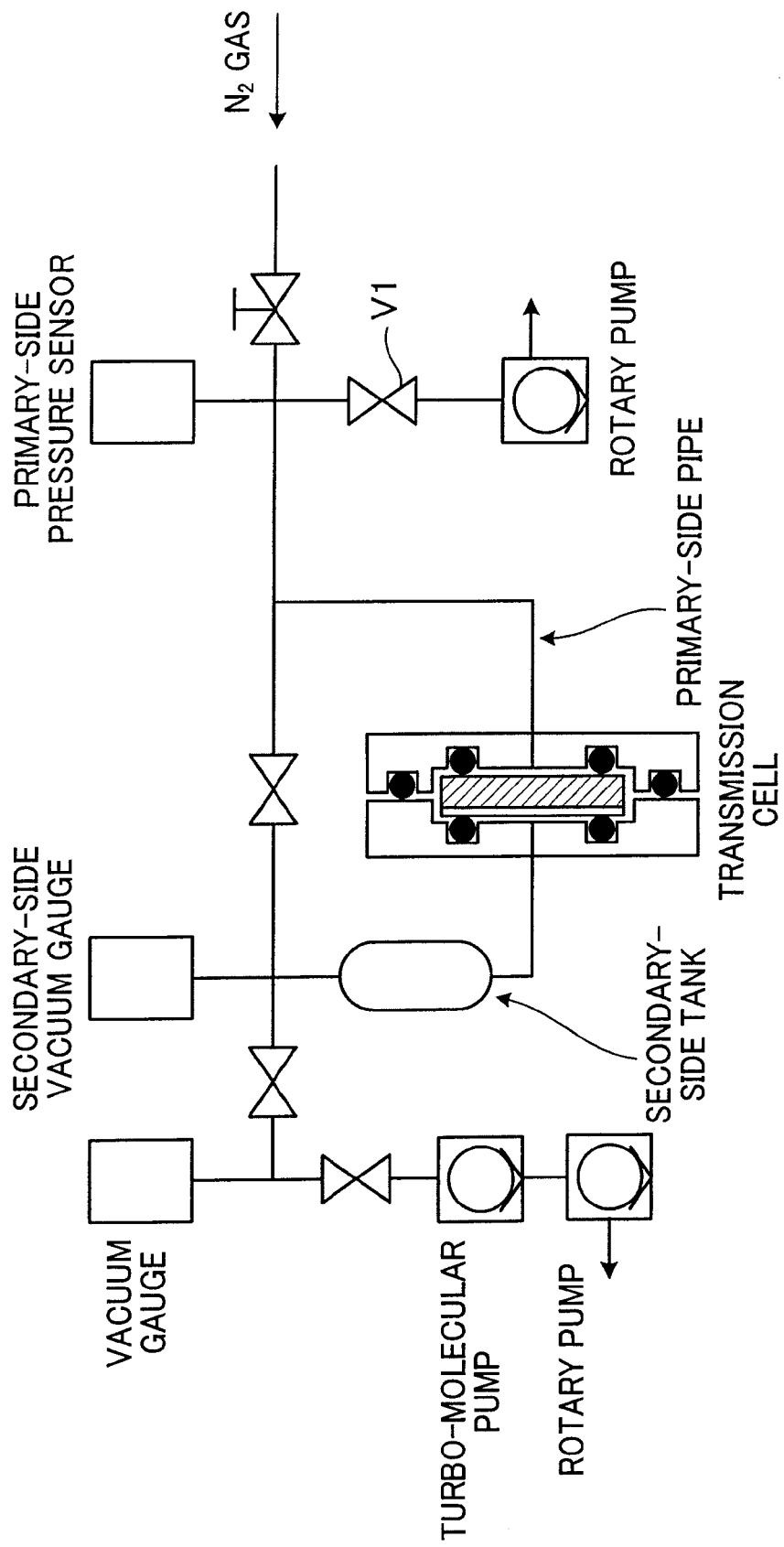
[FIG. 7] outlines an apparatus for measuring gas permeability.

A measurement sample is formed to be a disc having a diameter of about 30 mm or longer, and is sufficiently dried before the measurement of the nitrogen gas permeability. The dried measurement sample is provided in a transmission cell shown in FIG. 7, and the pressures of the primary and secondary sides of the transmission cell are reduced to predetermined vacuum states by a rotary pump (rotary vacuum pump) and a turbo-molecular pump. Subsequently, the rotary pump is stopped to close a valve (V1 show in FIG. 7). Thereafter, nitrogen gas is supplied to the primary side of the transmission cell at a constant gas pressure. The nitrogen gas moves from the primary side to the secondary side through the measurement sample, with the result that the pressure in the secondary side starts to rise. The rate of this pressure rise is measured. Based on this rate of pressure rise, a gas permeability (K) is calculated by the following equations (2) and (3).

$$K=(QL)/(\Delta PA) \quad (2)$$

$$Q=\{(p_2-p_1)V_0\}/t \quad (3)$$

In this connection, K indicates a nitrogen gas permeability, Q indicates an airflow quantity, $\Delta P$ indicates a pressure difference between the primary side and the secondary side, A indicates a transmission area, L indicates the thickness of the measurement sample, $p_1$ indicates an initial pressure in the secondary side, $p_2$ indicates an eventual pressure in the secondary side, $V_0$ indicates a capacity of the secondary side, and t indicates a measurement time.

Based on the measurement method and the calculation method above, the nitrogen gas permeability ($K_2$) of the tantalum carbide coating film 42 is figured out as below. First, the nitrogen gas permeability ($K_0$) of the tantalum carbide-coated carbon material 400 is measured. Subsequently, the tantalum carbide coating film 42 formed on the entirety of the carbon substrate 41 is removed by grinding, and the nitrogen gas permeability ($K_1$) of only the carbon substrate 41 is measured. Thereafter, the nitrogen gas permeability ($K_2$) is calculated by the relational expression (4) below.

$$(L_1+L_2)/K_0=L_1/K_1+L_2/K_2 \quad (4)$$

Here, $L_1$ indicates the thickness of the carbon substrate and $L_2$ indicates the coating film of the tantalum carbide.

<Thickness of Tantalum Carbide Coating Film>

The thickness of the tantalum carbide coating film 42 is preferably 10-100 μm. When the thickness of the tantalum carbide coating film is less than 10 μm, the gas permeability is high and hence the heat resistance and gas etching resistance are insufficient.

Now, the carbon substrate will be described.

(Production Method of Carbon Substrate)

Binder (e.g., pitch) is mixed into material powder and the mixture is molded and baked, with the result that a carbon substrate is obtained. According to need, graphitization and purification may be additionally carried out by known methods. Furthermore, the surface treatment of the carbon substrate may be carried out. This roughens the surface of the carbon substrate, and therefore the degree of close contact between the carbon substrate and the tantalum carbide coating film is improved.

(Carbon Substrate)

<Ash Content of Carbon Substrate>

The carbon substrate preferably includes as small amount of impurities as possible. More specifically, the elements included in the carbon substrate as impurities are preferably 0.3 ppm or smaller amount of aluminum, 1.0 ppm or smaller amount of iron, 0.1 ppm or smaller amount of magnesium, and 0.1 ppm or smaller amount of silicon. Furthermore, the total ash content (which may be simply denoted as ash content in this specification) of the carbon substrate is preferably 10 ppm or less. The ash content can be measured by a method of measuring ash content defined in JIS-R-7223.

<Gas Release Pressure of Carbon Substrate>

The gas release pressure of the carbon substrate is preferably not higher than $10^{-4}$ Pa/g at a reference temperature of 1000 degrees Celsius. The gas release pressure at the reference temperature of 1000 degrees Celsius indicates a pressure change resulting from the pressure rise in the atmosphere due to the desorption of gas molecules adhering to the surface and pores of the carbon substrate at the temperature of 1000 degrees Celsius. More specifically, this can be measured by thermal desorption spectroscopy (TDS) recited in Japanese Patent No. 2684106. When the gas release pressure is high, the CVD furnace is highly contaminated at the time of degassing, and impurities may be included in the tantalum carbide coating film.

<Thermal Expansion Coefficient of Carbon Substrate>

The thermal expansion coefficient of the tantalum carbide coating film falls within the range of $6.5$-$8.0 \times 10^{-6}$/K. On this account, the thermal expansion coefficient of the carbon substrate preferably falls within the range of $6.5$-$8.0 \times 10^{-6}$/K. Using this carbon substrate, it is possible to produce a tantalum carbide-coated carbon material in which a difference in the thermal expansion coefficient is small between the carbon substrate and the tantalum carbide coating film. With this, when swelling or shrinking occurs on account of a temperature change in the tantalum carbide-coated carbon material, a thermal stress is not easily generated in the tantalum carbide coating film and hence the tantalum carbide coating film is not easily peeled off.

The thermal expansion coefficient of the carbon substrate can be measured by a thermo-mechanical analyzer (Thermo Plus2 TMA8310) of Rigaku Corporation, for example. Other analyzers may be used instead of this.

<Density of Carbon Substrate>

The density of the carbon substrate preferably falls within the range of $1.65$-$1.90$ g/cm$^3$, and more preferably falls within the range of $1.73$-$1.83$ g/cm$^3$. When the density of the carbon substrate is in the range above, the mechanical strength of the carbon substrate is high.

An average radius of each of the pores of the carbon substrate is preferably $0.01$-$5$ μm. This realizes a sufficient anchor effect, with the result that the tantalum carbide coating film is not easily peeled off from the carbon substrate. The average pore radius can be measured by a mercury porosimeter which conducts measurement by a mercury press—in method. The diameter corresponds to a half of the accumulative pore capacity when the maximum pressure is 98 MPa and the contact angle between the sample and mercury is 141.3 degrees. When the average pore radius is shorter than 0.01 μm, the anchor effect is insufficient and hence the tantalum carbide coating film is easily peeled off from the carbon substrate.

The size and state of the carbon substrate are not limited to those shown in FIGS. 2-5. The size and state of the carbon substrate may be variously changed. Fore example, protrusions may be formed on the upper surface of the carbon substrate.

Now, why the carbon substrate is used as the base will be described. The substrate for forming the tantalum carbide coating film is preferably a carbon substrate or a tantalum substrate. The carbon substrate is preferred for its high processability. On the other hand, when the tantalum substrate is used, in some operating environments the carbon in the tantalum carbide coating film diffuses in the tantalum substrate, with the result that the entirety including the substrate become ceramic and loses toughness, i.e., becomes brittle. For this reason, when a tough carbon substrate is used as the central substrate, it is possible to prevent the entirety including the substrate from being transformed into tantalum carbide, and therefore a high-strength long-life tantalum carbide-coated carbon material is produced.

<Voids>

Voids are a collective term of holes that are formed on the surface of the tantalum carbide coating film and are several tens to several hundreds of nanometers in radius. It is considered that the voids are formed when residual substances in the grain boundaries are released along the grain boundaries. The following two are the reasons of this. Firstly, underdeveloped crystals of tantalum carbide, impurities, or the like remain in the grain boundaries. Secondly, destruction tends to occur from the grain boundaries because the strength thereof is lower than that of the crystal grains. For these two reasons, it is considered that the grain boundaries having low strength are broken at the time of thermal treatment of the tantalum carbide coating film, the residual substances in the grain boundaries are released along the grain boundaries, and the voids are formed. The formation of the voids is therefore restrained in the coating film with a smaller number of grain boundaries.

Furthermore, when the number of grain boundaries in the tantalum carbide coating film is small, even if small cracks are formed inside the coating film, the cracks are hardly widened and hardly reach the surface of the tantalum carbide coating film. It is noted that the cracks are formed by, for example, a stress generated by a difference in the thermal expansion coefficient between the carbon substrate and the tantalum carbide coating film and a stress on account of thermal shock.

The tantalum carbide-coated carbon material is used in, for example, components of a single crystal growth apparatus and an epitaxial growth apparatus for compound semiconductor and a jig. In the single crystal growth apparatus and the epitaxial growth apparatus, etching gas such as high-temperature (not lower than 1000 degrees Celsius) ammonia gas, hydrogen chloride gas, or the like is used. In this regard, the fineness of the tantalum carbide coating film is deteriorated when voids and cracks are formed therein. For this reason, the etching gas wears the carbon substrate. Furthermore, impurities released from the carbon substrate worn by the etching gas may pass through the tantalum carbide coating film and contaminate the product.

As described above, because the tantalum carbide coating film 42 has a maximum peak value of at least 80 degrees in the orientation angle of the (311) plane corresponding to a diffraction peak of the tantalum carbide as determined by X-ray diffraction, mainly existing in the tantalum carbide coating film 42 are crystal grains having the (311) planes that are in parallel to the surface of the carbon substrate 41 which is a part of the tantalum carbide coating film 42. Because the growth of the crystal grains constituting the tantalum carbide coating film 42 is facilitated, it is possible to significantly reduce the number of grain boundaries in the tantalum carbide coating film 42 as compared to conventional cases. A fine-grained high-strength tantalum carbide coating film 42 is therefore obtained, and the life of the tantalum carbide-coated carbon material 400 is extended.

Furthermore, because the tantalum carbide coating film has a maximum peak value of at least 80 degrees in the orientation angle of the (220) plane corresponding to a diffraction peak of the tantalum carbide as determined by X-ray diffraction, mainly existing in the tantalum carbide coating film 42 are crystal grains having the (220) planes that are in parallel to the surface of the carbon substrate 41 which is a part of the tantalum carbide coating film 42. Because the growth of the crystal grains constituting the tantalum carbide coating film 42 is facilitated, it is possible to significantly reduce the number of grain boundaries in the tantalum carbide coating film 42 as compared to conventional cases.

In addition to the above, because the sum of the intensities of the diffraction lines corresponding to the (311) plane and the (220) plane in the X-ray diffraction pattern of the tantalum carbide coating film 42 is not lower than 0.5 and not higher than 0.9 as compared to the sum total of the intensities of the diffraction lines corresponding to all crystal planes of the tantalum carbide in the X-ray diffraction pattern of the tantalum carbide coating film 42, a tantalum carbide coating film 42 having sufficiently grown tantalum carbide crystal grains and a significantly reduced number of grain boundaries is obtained.

In addition to the above, because the intensity of the diffraction line corresponding to the (311) plane or the (220) plane in the X-ray diffraction pattern of the tantalum carbide coating film 42 is the maximum, the number of grain boundaries in the tantalum carbide coating film 42 is reduced as compared to conventional cases.

In addition to the above, because in the X-ray diffraction pattern of the tantalum carbide coating film 42 the half value width of the diffraction line of the (220) plane or the (311) plane is 0.2 degrees or lower, the tantalum carbide coating film 42 is constituted by sufficiently grown tantalum carbide crystal grains having high crystallinity, with the result that the number of grain boundaries in the tantalum carbide coating film 42 is significantly reduced as compared to conventional cases.

In addition to the above, according to the methods (2), (4), and (5), the crystal grains constituting the tantalum carbide coating film 42 gradually increase in size from the surface of the carbon substrate 41 toward the outer surface of the tantalum carbide coating film 42. With this, the degree of close contact between the tantalum carbide coating film 42 and the carbon substrate 41 is improved, whereas the number of grain boundaries, which may cause the generation of voids, is significantly reduced.

According to the method of the present invention (the above-described formation method (2) of the tantalum carbide coating film by CVD treatment), tantalum carbide crystalline nuclei are formed in the concaves of the carbon substrate surface, and the crystallinity of the tantalum carbide coating film is gradually improved by gradually increasing the production temperature in the crystal growth step. Because this makes it possible to form a tantalum carbide coating film fitting to the irregularities of the carbon substrate surface, the tantalum carbide coating film is not easily peeled off from the carbon substrate, and the number of grain boundaries is small in the tantalum carbide coating film as compared to the conventional cases because the crystallinity is improved around the outer surface of the tantalum carbide coating film.

In addition to the above, because in the crystalline nucleus formation step the temperatures at which the tantalum carbide crystalline nuclei are formed are 850-950 degrees Celsius, sufficient tantalum carbide crystalline nuclei are formed in the concaves of the carbon substrate surface and a tantalum carbide coating film fitting to the irregularities on the surface of the carbon substrate is obtained, with the result that the degree of close contact between the tantalum carbide coating film and the carbon substrate is improved.

In addition to the above, because the temperature increase in the heating step is 50 degrees Celsius or higher, a tantalum carbide coating film fitting to the irregularities on the surface of the carbon substrate is obtained at around the surface of the carbon substrate, whereas a tantalum carbide coating film in which the crystal grains are grown and the number of grain boundaries is small is obtained at around the tantalum carbide coating film.

In addition to the above, because the production temperature is kept unchanged after the heating step, it is possible to form a tantalum carbide coating film having grown crystal grains. It is therefore possible to obtain a tantalum carbide coating film having a small number of grain boundaries as compared to the conventional cases and having a desired thickness.

In addition to the above, because in the heating step the production temperature is increased at a constant rate, rapid improvement in the crystallinity of the tantalum carbide crystal grains is prevented and hence the peeling off of the tantalum carbide coating film is prevented. As a result, the crystallinity of the tantalum carbide coating film is gradually improved.

In addition to the above, according to, for example, the above-described method (3) of the present invention, the number of grain boundaries in the tantalum carbide coating film 22 formed in the tantalum carbide coating film formation process is significantly small as compared to the conventional cases, and no impurities are released from the tantalum carbide coating film 22 at the time of the formation of a new tantalum carbide coating film (second formation process). For this reason, no impurity gas exists between the base tantalum carbide coating film 22 and the new tantalum carbide coating film 23. Furthermore, the crystallinity of the base tantalum carbide coating film 22 rarely changes at the time of the formation of the new tantalum carbide coating film 23, and hence the crystallinity of the base film 22 is substantially identical with the crystallinity of the new tantalum carbide coating film 23. The base tantalum carbide coating film 22 and the tantalum carbide coating film 23 therefore closely contact each other because of the substantially no difference in the crystallinity. As described above, because the tantalum carbide coating film has a maximum peak value of at least 80 degrees in the orientation angle of the (311) plane corresponding to a diffraction peak of the tantalum carbide as determined by X-ray diffraction, mainly existing in the tantalum carbide coating film are crystal grains having the (311) planes that are in parallel to the surface of the carbon substrate which is a part of the tantalum carbide coating film. Because the growth of the crystal grains constituting the tantalum carbide coating film is facilitated, the number of grain boundaries in the tantalum carbide coating film is significantly reduced as compared to the conventional cases. A fine-grained high-strength tantalum carbide coating film is therefore obtained, and the life of the tantalum carbide-coated carbon material is extended.

In addition to the above, the first formation process and the second formation process are carried out while the carbon substrate 21 is supported by the supporting rod 25 (support), and an uncoated part of the tantalum carbide coating film 22 formed by the supporting rod 25 in the first formation process is coated in the second formation process. As such, the tantalum carbide coating film is formed on the entire surface of the carbon substrate 21.

In addition to the above, as the formation method (2) of tantalum carbide coating film by CVD treatment is performed in the first formation process and the formation method (1) of tantalum carbide coating film by CVD treatment is performed in the second formation process, tantalum carbide crystalline nuclei are formed in the concaves of the carbon substrate surface, with the result that a tantalum carbide coating film fitting to the irregularities of the carbon substrate surface is formed. This makes it possible to obtain a tantalum carbide coating film which is not easily peeled off from a carbon substrate. Furthermore, the crystallinity of the tantalum carbide coating film is gradually improved by gradually increasing the production temperature in the crystal growth step. As a result, the crystallinity is developed at around the surface of the tantalum carbide coating film, and therefore a tantalum carbide coating film having a small number of grain boundaries as compared to the conventional cases is obtained.

In addition to the above, because the tantalum carbide coating film has a maximum peak value of at least 80 degrees in the orientation angle of the (220) plane corresponding to a diffraction peak of the tantalum carbide as determined by X-ray diffraction, mainly existing in the tantalum carbide coating film are crystal grains having the (220) planes that are in parallel to the surface of the carbon substrate which is a part of the tantalum carbide coating film. Because the growth of the crystal grains constituting the tantalum carbide coating film is facilitated, the number of grain boundaries in the tantalum carbide coating film is significantly reduced as compared to the conventional cases.

In addition to the above, because the sum of the intensities of the diffraction lines corresponding to the (311) plane and the (220) plane in the X-ray diffraction pattern of the tantalum carbide coating film is not lower than 0.5 and not higher than 0.9 as compared to the sum total of the intensities of the diffraction lines corresponding to all crystal planes of the tantalum carbide in the X-ray diffraction pattern of the tantalum carbide coating film, a tantalum carbide coating film constituted by sufficiently-grown tantalum carbide crystal grains is obtained, and therefore the number of grain boundaries in the tantalum carbide coating film is significantly reduced as compared to the conventional cases.

In addition to the above, the intensity of the diffraction line corresponding to the (311) plane or the (220) plane in the X-ray diffraction pattern of the tantalum carbide coating film 22 is the maximum. This makes it possible to reduce the number of grain boundaries of the tantalum carbide coating film as compared to the conventional cases.

In addition to the above, the half value width of the diffraction line of the (311) plane or the (220) plane in the X-ray diffraction pattern of the tantalum carbide coating film is not higher than 0.12 degrees. Because this results in the formation of the first tantalum carbide coating film having high crystallinity and constituted by sufficiently grown tantalum carbide crystal grains, the number of grain boundaries in the tantalum carbide coating film is considerably reduced as compared to the conventional cases.

In addition to the above, according to the formation method (4) of the tantalum carbide coating film of the present invention, a tantalum coating film is formed on the surface of a carbon substrate 1 and this tantalum coating film is transformed to a tantalum carbide coating film 2. This significantly reduces the number of grain boundaries in the tantalum carbide as compared to the conventional cases. Furthermore, because the tantalum coating film is formed first on the carbon substrate 1, the tantalum coating film is softened under a high temperature environment, with the result that the tantalum carbide coating film 2 fits to the irregularities on the surface of the carbon substrate 1. A tantalum carbide-coated carbon material having a fine-grained high-strength tantalum carbide coating film and closely contacting the carbon substrate 1 is obtained.

Furthermore, by repeating the tantalum coating film formation process and the carburizing process in order, it is possible to easily change the thickness of the tantalum carbide coating film.

Furthermore, the thickness of the tantalum coating film is changeable by repeating the tantalum coating film formation process more than once.

In addition to the above, by performing carburization at temperatures of 1700 degrees Celsius to 2500 degrees Celsius in the carburizing process, a tantalum carbide-coated carbon material which is not easily worn under high-temperature environments is obtained.

In addition to the above, because the thermal expansion coefficient of the carbon substrate 1 is $6.5\text{-}8.0 \times 10^{-6}$/K, the thermal expansion coefficient of the carbon substrate 1 is close to the thermal expansion coefficient of the tantalum carbide, and hence a thermal stress applied to the tantalum carbide coating film 2 is reduced. It is therefore possible to obtain a tantalum carbide-coated carbon material having a tantalum carbide coating film 2 which is not easily peeled off from a carbon substrate 1.

In addition to the above, the tantalum coating process is carried out while a coating object is supported by a support, and an uncoated part formed by the support in the initial tantalum coating film formation process is coated in the second or subsequent tantalum coating film formation process. With this, the tantalum carbide coating film is formed on the entire surface of the carbon substrate.

In addition to the above, according to the formation method (5) of the tantalum carbide coating film of the present invention, a tantalum coating film is formed on the surface of a carbon substrate, a first tantalum carbide coating film is formed by transforming the tantalum coating film into a tantalum carbide coating film, and a second tantalum carbide coating film is formed on the first tantalum carbide coating film. In this way, a tantalum carbide coating film succeeding to the crystal orientation of the first tantalum carbide coating film is easily formed, and the number of grain boundaries is significantly reduced as compared to the conventional cases. As a result, a tantalum carbide-coated carbon material having a fine-grained high-strength tantalum carbide coating film is obtained. Furthermore, by differentiating the production method of the second tantalum carbide coating film from the production method of the first tantalum carbide coating film, only the tantalum carbide coating film formation process is required as a production process of the first tantalum carbide coating film, which requires the tantalum coating film formation process and the carburizing process.

In addition to the above, by carburizing the tantalum film at temperatures of 1700 degrees Celsius to 2500 degrees Celsius in the carburizing process, a tantalum carbide-coated carbon material which is not easily worn under high-temperature environments is obtained.

In addition to the above, because the thermal expansion coefficient of the carbon substrate is $6.5\text{-}8.0 \times 10^{-6}$/K, the thermal expansion coefficient of the carbon substrate is close to the thermal expansion coefficient of the tantalum carbide, and hence a thermal stress applied to the tantalum carbide coating film is reduced. As a result, a tantalum carbide-coated carbon material having a tantalum carbide coating film which is not easily peeled off from a carbon substrate is obtained.

In addition to the above, because the tantalum carbide coating film has a maximum peak value of at least 80 degrees in the orientation angle of the (311) plane corresponding to a diffraction peak of the tantalum carbide as determined by X-ray diffraction, mainly existing in the tantalum carbide coating film are crystal grains having the (311) planes that are in parallel to the surface of the carbon substrate which is a part of the tantalum carbide coating film. This makes it possible to obtain a fine-grained high-strength tantalum carbide coating film in which the number of grain boundaries is small.

In addition to the above, because the tantalum carbide coating film has a maximum peak value of at least 80 degrees in the orientation angle of the (220) plane corresponding to a diffraction peak of the tantalum carbide as determined by X-ray diffraction, mainly existing in the tantalum carbide coating film are crystal grains having the (220) planes that are in parallel to the surface of the carbon substrate which is a part of the tantalum carbide coating film. This makes it possible to obtain a fine-grained high-strength tantalum carbide coating film in which the number of grain boundaries is small.

In addition to the above, because the sum of the diffraction intensities of the (311) plane and the (220) plane in the X-ray diffraction pattern of the tantalum carbide coating film is not lower than 0.5 and not higher than 0.9 as compared to the sum total of the intensities of the diffraction lines corresponding to all crystal planes of the tantalum carbide in the X-ray diffraction pattern of the tantalum carbide coating film, a tantalum carbide coating film constituted by sufficiently-grown tantalum carbide crystal grains is obtained, and therefore a fine-grained high-strength tantalum carbide film in which the number of grain boundaries is small is obtained.

In addition to the above, because the intensity of the diffraction line of the (311) plane in the X-ray diffraction pattern of the tantalum carbide coating film is the maximum, a fine-grained high-strength tantalum carbide film in which the number of grain boundaries is small is obtained.

In addition to the above, because the half value width of the diffraction line of the (311) plane is not higher than 0.12 degrees in the X-ray diffraction pattern of the tantalum carbide coating film, high crystallinity and sufficient growth of the crystal grains are achieved. As a result, a fine-grained high-strength tantalum carbide coating film in which the number of grain boundaries is small is obtained.

EXAMPLES

Examples 1-4

In these examples, a tantalum carbide coating film was formed by the above-described formation method (1) of the tantalum carbide coating film by CVD treatment.

A graphite substrate in which the thermal expansion coefficient was $7.8 \times 10^{-6}$/K, the gas release pressure was $10^{-6}$ Pa/g at a reference temperature of 1000 degrees Celsius, the ash content was 2 ppm, the diameter was 60 mm, and the thickness was 10 mm was subjected to CVD treatment under the CVD treatment conditions shown in Table 2 below, and a tantalum carbide coating film was formed on the carbon substrate. In this connection, the composition ratio C/Ta of the tantalum carbide coating film was adjusted to 1.0 to 2.0.

TABLE 2

| | TEMPERATURE (°) | PRESSURE (TORR) | TANTALUM PENTACHLORIDE (SCCM) | METHANE (SCCM) | ARGON (SCCM) |
|---|---|---|---|---|---|
| EXAMPLE1 | 900 | 5 | 20 | 500 | 4000 |
| EXAMPLE2 | 950 | 5 | 20 | 500 | 4000 |
| EXAMPLE3 | 1000 | 5 | 20 | 500 | 4000 |
| EXAMPLE4 | 1050 | 5 | 20 | 500 | 4000 |

Figure 8:
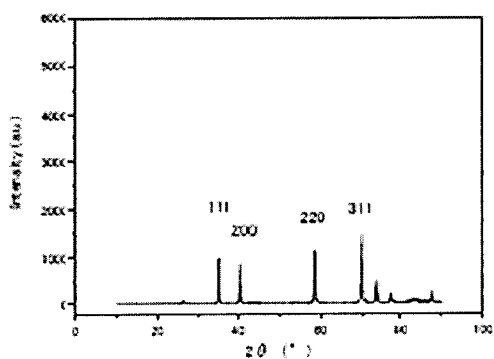
[FIG. 8(a)] shows results of Examples 1-4.
[FIG. 8(b)] shows results of Examples 1-4.
Figure 8:
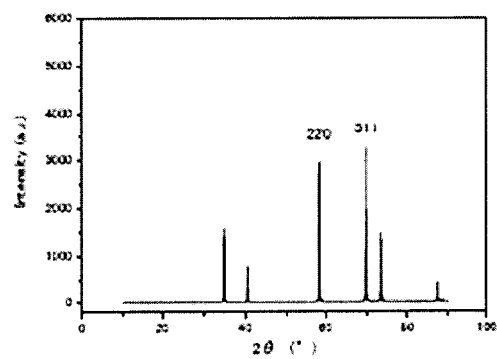
Figure 8:
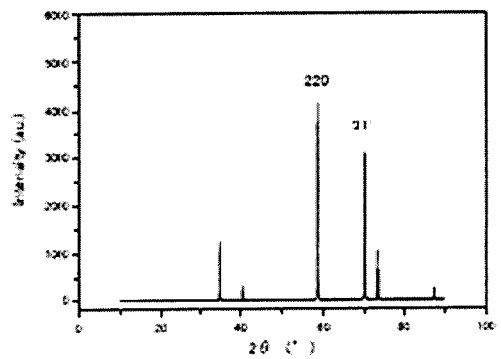
Figure 8:
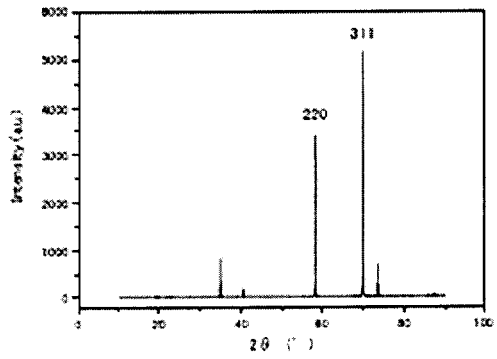

Images (SEM images) of the surfaces of the tantalum carbide coating films obtained in Example 1-4, which were taken by an electron microscope, are shown in FIG. 8(a), and the X-ray diffraction patterns are shown in FIG. 8(b).

As shown in FIG. 8(a), in the SEM images of Example 1-4, the crystal grains of the tantalum carbide coating film were observed. Furthermore, according to FIG. 8(b), the (111) plane, the (200) plane, the (220) plane, the (311) plane, the (222) plane, and the (400) plane were observed in the X-ray diffraction patterns of Example 1-4, and the diffraction line of at least one of the (220) plane and the (311) plane exhibited the highest diffraction intensity.

Now, the sum of the I(220) and the I(311) with respect to Ip in Examples 1-4 and the evaluation result of the half value width of the (311) plane of the tantalum carbide in each coating film are shown in Table 3.

TABLE 3

| | (I(220) + I(311))/Ip | HALF VALUE WIDTH OF (311) PLANE (°) |
|---|---|---|
| EXAMPLE1 | 0.68 | 0.18 |
| EXAMPLE2 | 0.69 | 0.12 |
| EXAMPLE3 | 0.85 | 0.11 |
| EXAMPLE4 | 0.90 | 0.10 |

According to Table 3, the sum of I(220) and I(311) with respect to Ip in each of Examples 1-4 fell within the range of not lower than 0.5 and not higher than 0.90, and the half value width of the (311) plane was 0.20 or lower.

Figure 9:
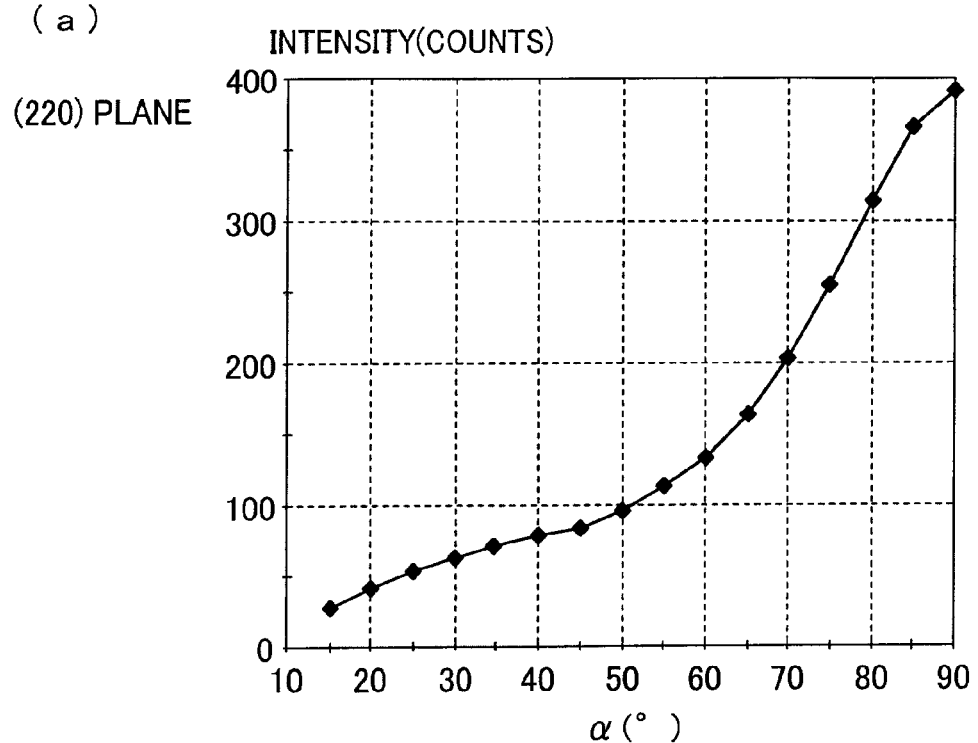
[FIG. 9] shows a result of Example 3.
Figure 9:
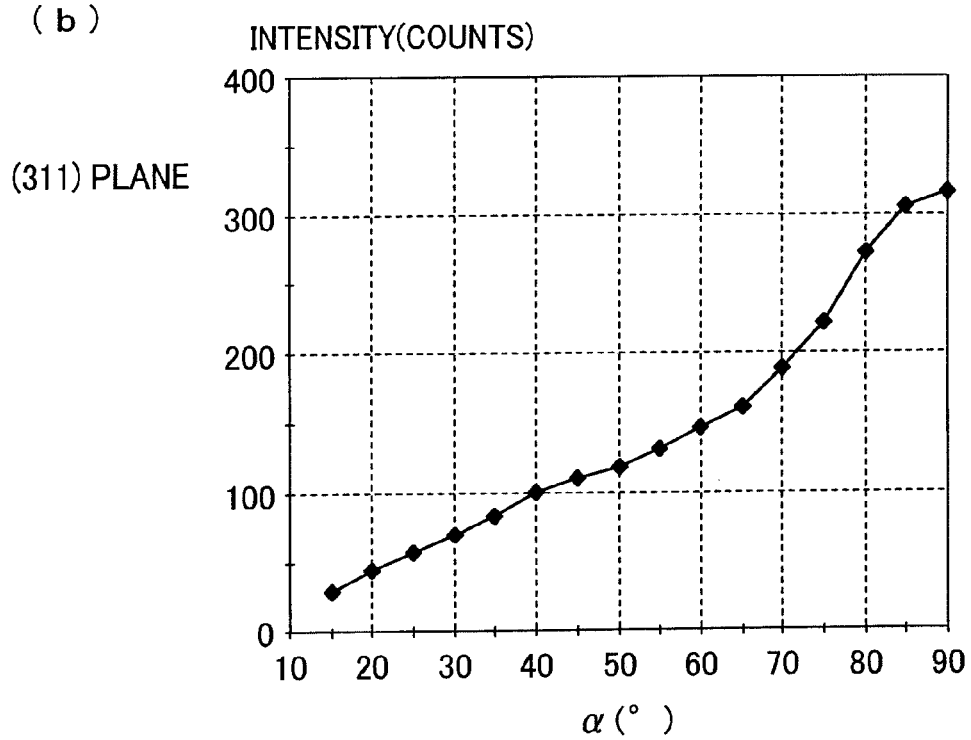

The orientation angles of the (220) plane and the (311) plane of the tantalum carbide, observed as a result of the X-ray diffraction of the surface layer of Example 3, are shown in FIG. 9.

According to FIG. 9, the tantalum carbide coating film of Example 3 had a maximum peak value of at least 80 degrees in the orientation angles of the (220) plane and the (311) plane corresponding to a diffraction peak of the tantalum carbide as determined by X-ray diffraction. In this regard, the crystal grains of the tantalum carbide were grown, and the number of grain boundaries in the tantalum carbide coating film was small.

Furthermore, after the thermal treatment of the tantalum carbide coating film of Examples 1-4 at 1600 degrees Celsius, no voids were observed on the surface of the tantalum carbide coating film.

Examples 5 and 6

In these examples, a tantalum carbide coating film was formed by the above-described formation method (2) of the tantalum carbide coating film by CVD treatment.

A graphite substrate in which the thermal expansion coefficient was $7.8 \times 10^{-6}$/K, the gas release pressure was $10^{-6}$ Pa/g at a reference temperature of 1000 degrees Celsius, the ash content was 2 ppm, the diameter was 60 mm, and the thickness was 10 mm was subjected to CVD treatment under the CVD treatment temperature conditions shown in Table 4 below, and a tantalum carbide coating film was formed on the graphite substrate. In this connection, the composition ratio C/Ta of the tantalum carbide coating film was adjusted to 1.0 to 2.0. The pressure in the furnace and the gas flow in the CVD treatment were arranged to be identical with those in Examples 1-4.

TABLE 4

| | PROCESSING TEMPERATURE (° C.) | TEMPERATURE AFTER TEMPERATURE INCREASE (° C.) | TEMPERATURE INCREASE RATE (° C./hr) |
|---|---|---|---|
| EXAMPLE5 | 940 | 1000 | 100 |
| EXAMPLE6 | 900 | 1000 | 100 |

In Examples 5 and 6, the CVD treatment temperature was gradually increased at the rate of 100 degrees Celsius/Hr, the heating was stopped when the treatment temperature reached 1000 degrees Celsius, and a tantalum carbide coating film was formed until a desired thickness was obtained, while the treatment temperature was kept at 1000 degrees Celsius. Images (SEM images) of the cross sections of the obtained tantalum carbide coating film, which were taken by an electron microscope, are shown in FIG. 10.

Figure 10:
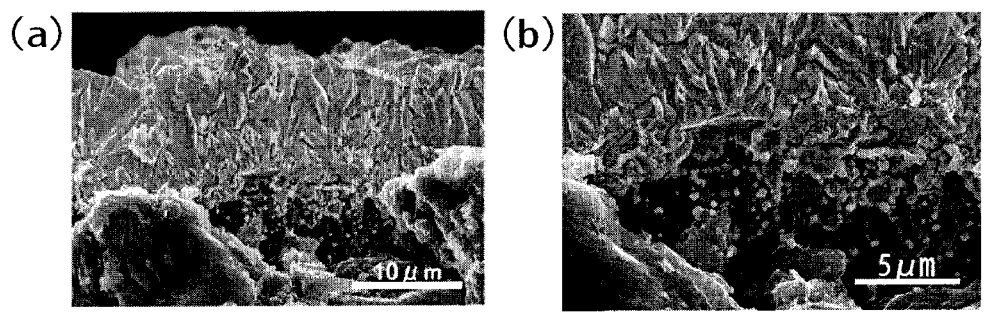
[FIG. 10] shows results of Examples 5 and 6.
Figure 10:
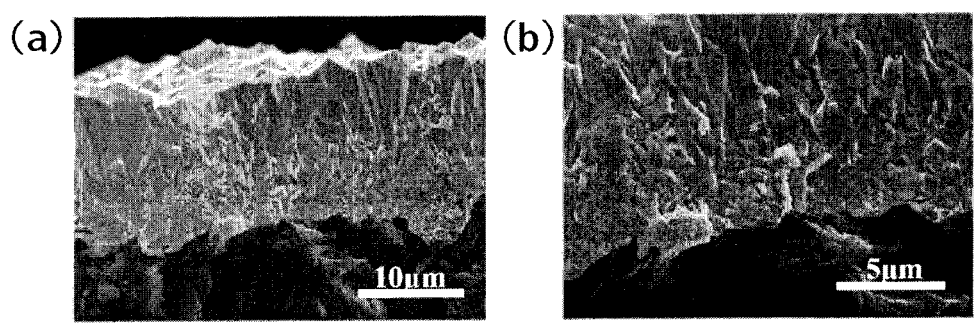

As shown in FIG. 10, the tantalum carbide coating film was formed in the pores and the concaves of the carbon substrate surface in Examples 5 and 6. The tantalum carbide crystals constituting the tantalum carbide coating film clearly increase in size gradually from around the surface of the graphite substrate toward the outer surface of the coating film. Furthermore, the crystal grains were grown at around the outer surface of the tantalum carbide coating film, and the number of the grain boundaries were significantly reduced.

Figure 11:
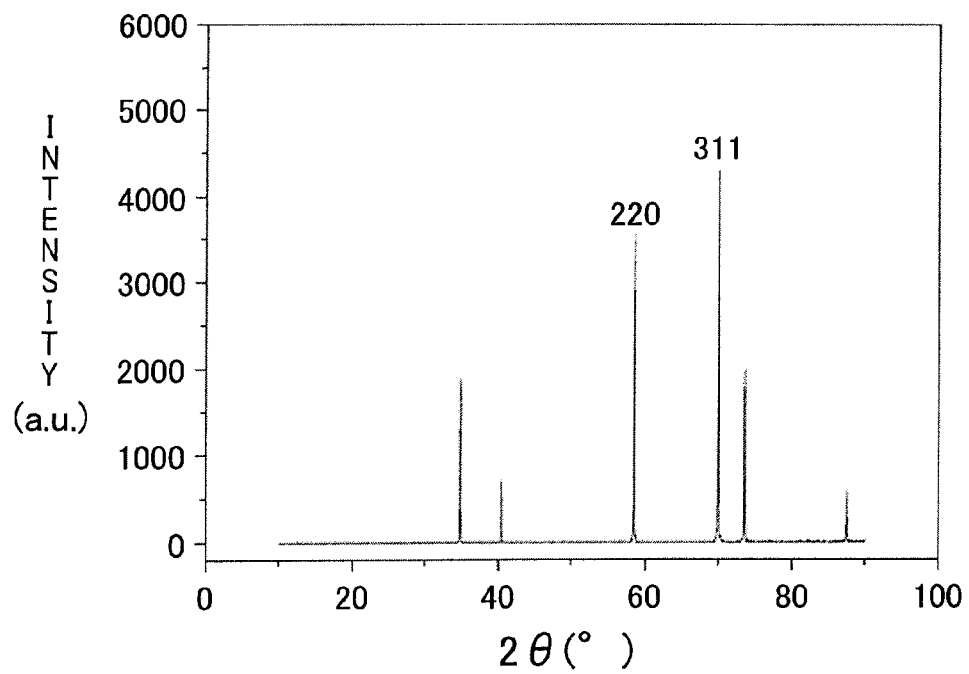
[FIG. 11] shows results of Examples 5 and 6.
Figure 11:
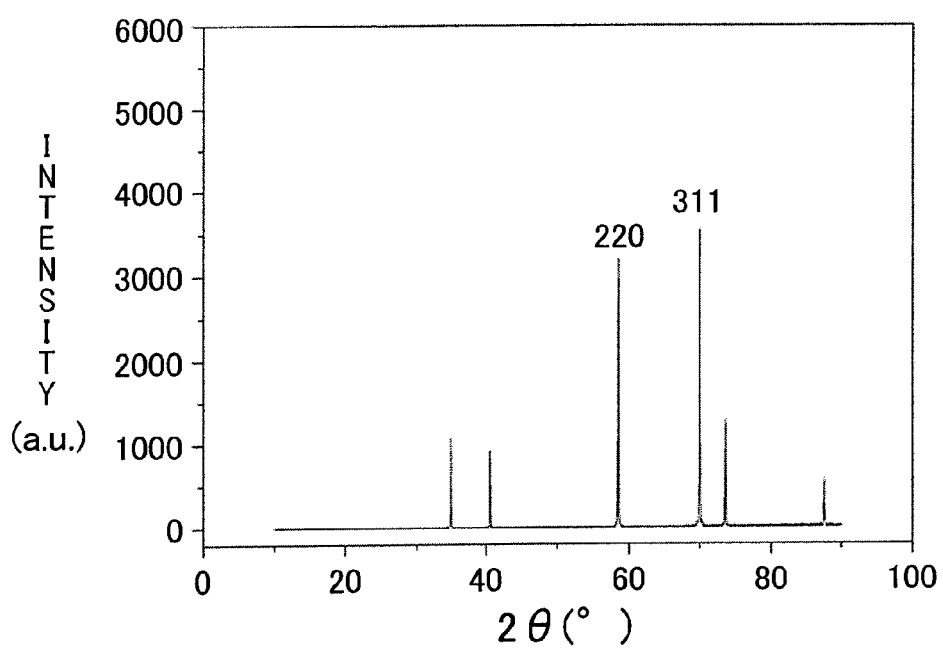

Results of the X-ray diffraction patterns of Examples 5 and 6 are shown FIG. 11. According to FIG. 11, in the X-ray diffraction patterns of Examples 5 and 6, the (111) plane, the (200) plane, the (220) plane, the (311) plane, the (222) plane, and the (400) plane were observed. Furthermore, the diffraction line of at least one of the (220) plane and the (311) plane exhibited the highest diffraction intensity.

Now, the sum of I(220) and I(311) with respect to Ip in Examples 5 and 6 and the evaluation result of the half value width of the (311) plane of the tantalum carbide of each coating film are shown in Table 5.

TABLE 5

|  | (I(220) + I(311))/Ip | HALF VALUE WIDTH OF (311) PLANE (°) |
|---|---|---|
| EXAMPLE 5 | 0.60 | 0.10 |
| EXAMPLE 6 | 0.64 | 0.10 |

According to Table 5, in Examples 5 and 6 the sum of I(220) and I(311) with respect to Ip fell within the range of not lower than 0.5 and not higher than 0.90, and the half value width of the (311) plane was 0.20 or lower.

Figure 12:
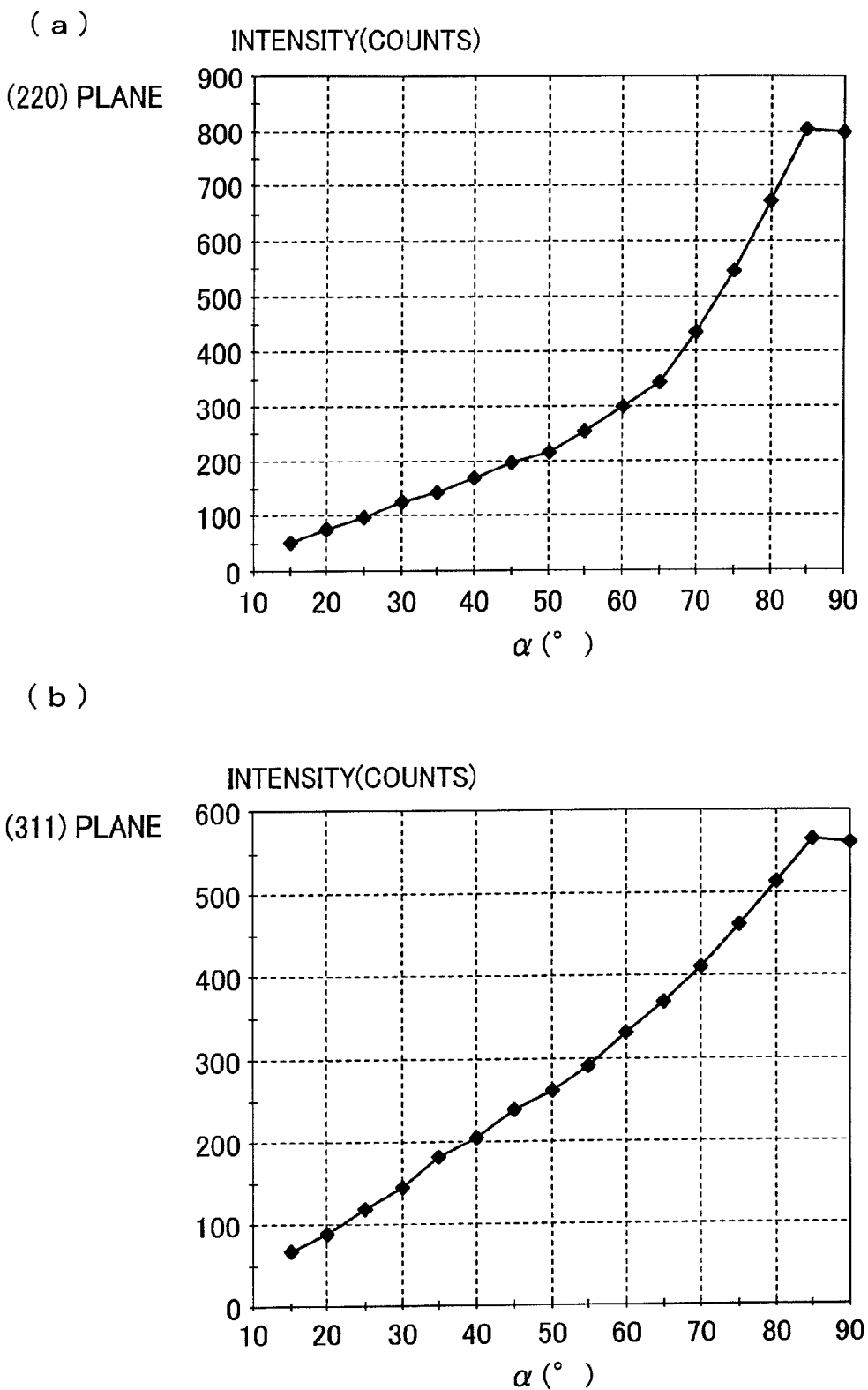
[FIG. 12] shows a result of Example 6.

The orientation angles of the (220) plane and the (311) plane of the tantalum carbide, observed as a result of the X-ray diffraction of the surface layer of Example 6, are shown in FIG. 12.

According to FIG. 12, the tantalum carbide coating film of Example 6 had a maximum peak value of at least 80 degrees in the orientation angles of the (220) plane and (311) plane corresponding to a diffraction peak of the tantalum carbide as determined by X-ray diffraction. In this regard, the crystal grains of the tantalum carbide were grown, and the number of grain boundaries in the tantalum carbide coating film was small.

Furthermore, after the thermal treatment of the tantalum carbide coating film obtained in Examples 5 and 6 at 1600 degrees Celsius, no voids were observed on the surface of the tantalum carbide coating film.

Examples 7 and 8

In these examples, a tantalum carbide coating film was formed by the above-described formation methods (2) and (3) of the tantalum carbide coating film by CVD treatment.

Example 7

A graphite substrate in which the thermal expansion coefficient was $8 \times 10^{-6}$/K, the gas release pressure was $10^{-6}$ Pa/g at a reference temperature of 1000 degrees Celsius, the ash content was 2 ppm, the diameter was 60 mm, and the thickness was 10 mm was subjected to CVD treatment at the CVD treatment temperature of 1000 degrees Celsius, with the result that a base tantalum carbide coating film was formed on the graphite substrate. In this connection, the composition ratio C/Ta of the tantalum carbide coating film was adjusted to 1.0 to 2.0. The conditions such as the pressure in the CVD treatment and the material gas were identical with those in Examples 1-4. Thereafter, the obtained tantalum carbide-coated carbon material was subjected to CVD treatment under the CVD conditions identical with the above, and a new tantalum carbide coating film was formed.

Example 8

A graphite substrate in which the thermal expansion coefficient was $8 \times 10^{-6}$/K, the gas release pressure was $10^{-6}$ Pa/g at a reference temperature of 1000 degrees Celsius, the ash content was 2 ppm, the diameter was 60 mm, and the thickness was 10 mm was subjected to CVD treatment at the CVD treatment temperature of 900 degrees Celsius, with the result that a tantalum carbide coating film was formed on the graphite substrate. Thereafter, the CVD treatment temperature was gradually increased at the rate of 100 degrees Celsius/Hr, the heating was stopped when the treatment temperature reached 1000 degrees Celsius, and a base tantalum carbide coating film was formed until a desired thickness was obtained, while the treatment temperature was kept at 1000 degrees Celsius and the composition ratio of C/Ta of the coating film was adjusted to 1.0-2.0. Thereafter, the CVD treatment was performed again on the base coating film at the CVD treatment temperature of 1000 degrees Celsius, and a new tantalum carbide coating film was formed. The conditions such as the pressure and material gas in this case was arranged to be identical with those in Examples 1-4.

Images (SEM images) of the cross sections of the obtained tantalum carbide coating films, which were taken by an electron microscope, are shown in FIG. 13. According to FIG. 13, in Examples 7 and 8, the crystal grains of the new tantalum carbide coating film formed by double coating were grown in succession to the growth of the crystal grains of the base tantalum carbide coating film. For this reason, peeling off did not occur at the boundary surface of the multiple coating films (i.e., at the boundary surface between the base tantalum carbide coating film and the new tantalum carbide coating film).

Figure 14:
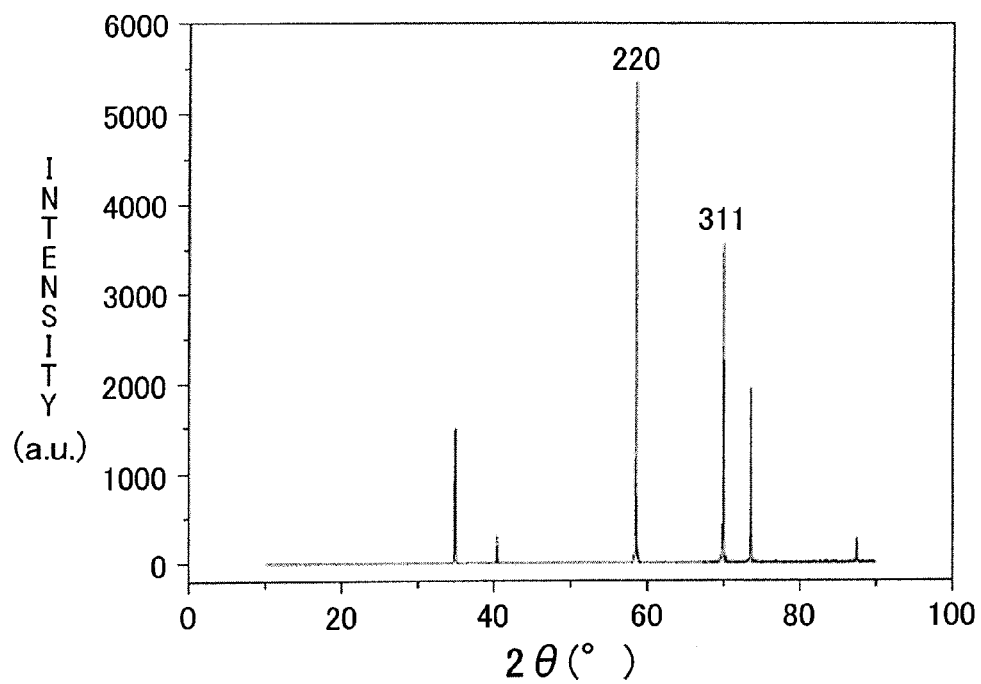
[FIG. 14] shows results of Examples 7 and 8.
Figure 14:
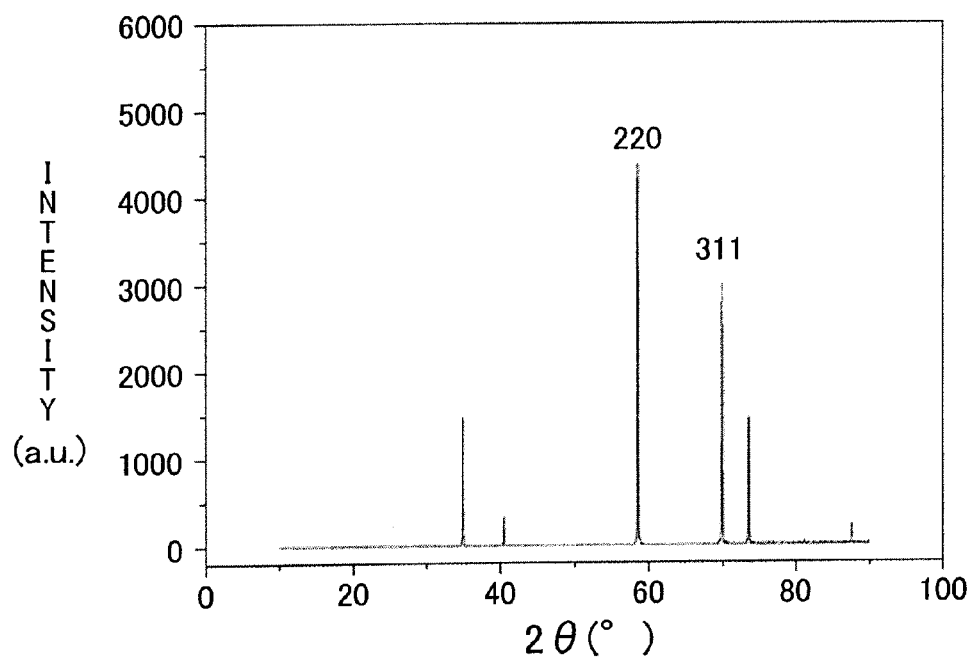

Now, the results of the X-ray diffraction patterns of Examples 7 and 8 are shown in FIG. 14. According to FIG. 14, in the X-ray diffraction patterns of Examples 7 and 8, the (111) plane, the (200) plane, the (220) plane, the (311) plane, the (222) plane, and the (400) plane were observed. Furthermore, the diffraction line of at least one of the (220) plane and the (311) plane exhibited the highest diffraction intensity.

Now, the sum of I(220) and I(311) with respect to Ip in Examples 7 and 8 and the evaluation result of the half value width of the (311) plane of the tantalum carbide of each coating film are shown in Table 6.

TABLE 6

|  | (I(220) + I(311))/Ip | HALF VALUE WIDTH OF (311) PLANE (°) |
|---|---|---|
| EXAMPLE 7 | 0.68 | 0.10 |
| EXAMPLE 8 | 0.64 | 0.10 |

According to Table 6, in Examples 7 and 8 the sum of I(220) and I(311) with respect to Ip fell within the range of not lower than 0.5 and not higher than 0.90, and the half value width of the (311) plane was 0.20 or lower.

Figure 15:
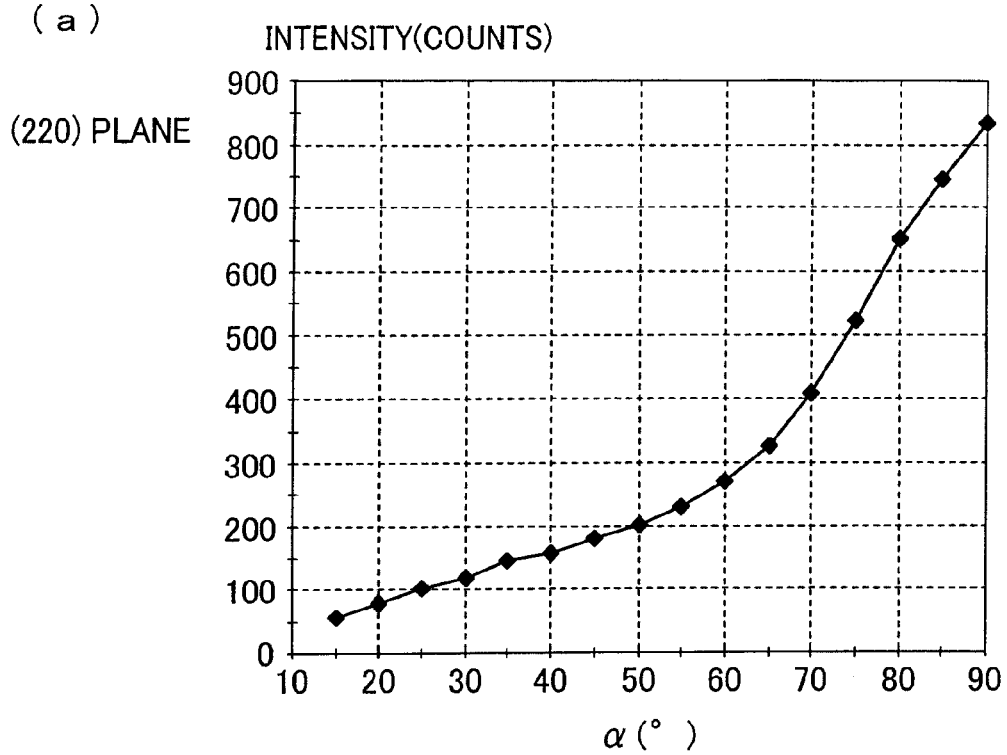
[FIG. 15] shows a result of Example 7.
Figure 15:
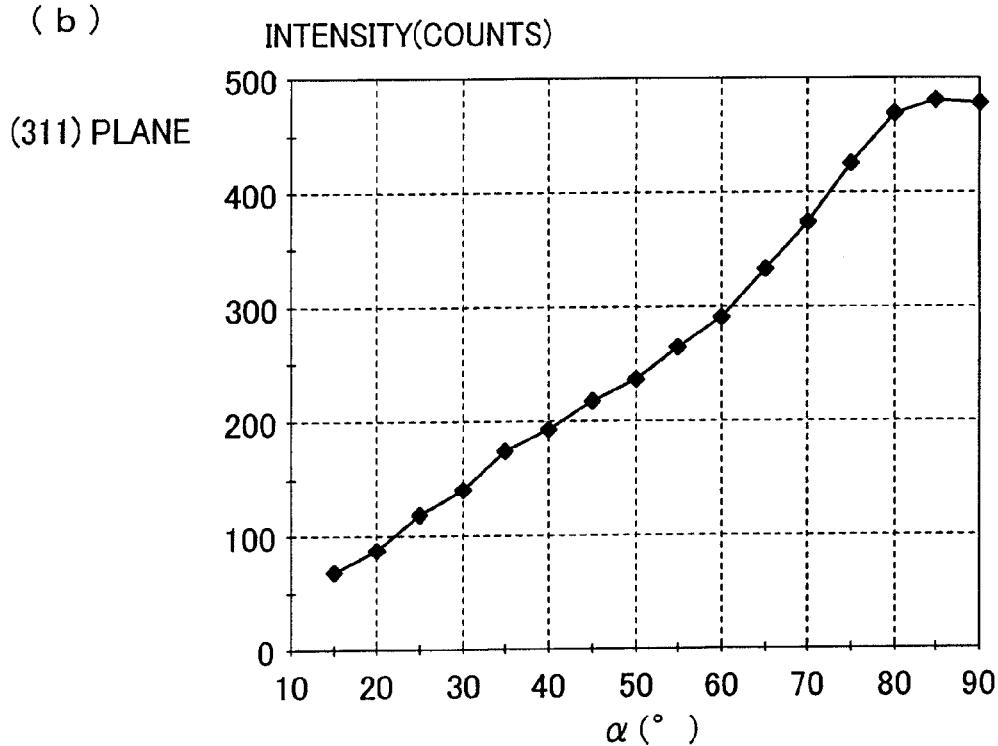

The orientation angles of the (220) plane and the (311) plane of the tantalum carbide, observed as a result of the X-ray diffraction of the surface layer of Example 7, are shown in FIG. 15. According to FIG. 12, the tantalum carbide coating film of Example 6 had a maximum peak value of at least 80 degrees in the orientation angles of the (220) plane and (311) plane corresponding to a diffraction peak of the tantalum carbide as determined by X-ray diffraction. In this case, the crystal grains of the tantalum carbide were developed and the number of grain boundaries in the tantalum carbide coating film was small.

Furthermore, after the thermal treatment of the tantalum carbide coating film obtained in Examples 7 and 8 at 1600 degrees Celsius, no voids were observed on the surface of the tantalum carbide coating film.

Example 9

In this example, a tantalum carbide coating film was formed by the above-described formation method (4) of the tantalum carbide coating film.

A graphite substrate in which the thermal expansion coefficient was $7.8 \times 10^{-6}$/K, the gas release pressure was $10^{-6}$ Pa/g at a reference temperature of 1000 degrees Celsius, the ash content was 2 ppm, the diameter was 60 mm, and the thickness was 10 mm was subjected to CVD treatment under the CVD treatment conditions shown in Table 7 below, with the result that a tantalum coating film was formed on the graphite substrate.

TABLE 7

| TEMPER-ATURE (°) | PRES-SURE (TORR) | TANTALUM PENTACHLORIDE (SCCM) | HYDROGEN (SCCM) | ARGON (SCCM) |
| --- | --- | --- | --- | --- |
| 1000 | 5 | 20 | 500 | 4000 |

Figure 16:
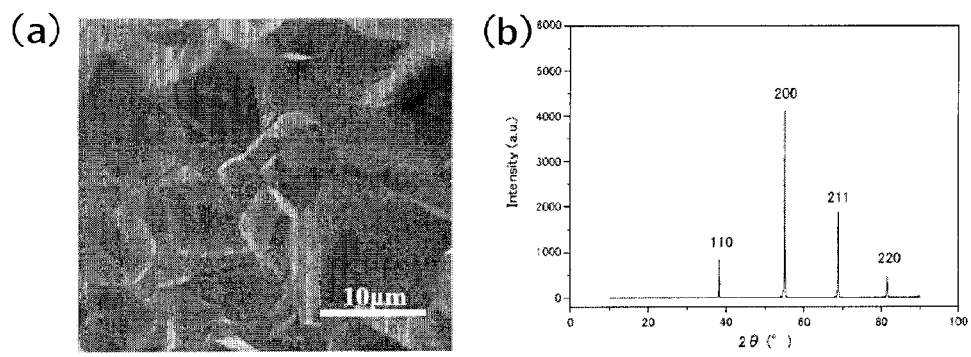
[FIG. 16] shows a result of the tantalum coating film of Example 9.

An images (SEM image) of the cross section of the obtained tantalum coating film, which was taken by an electron microscope, and the X-ray diffraction pattern are shown in FIG. 16. FIG. 16(a) shows the SEM image, whereas FIG. 16(b) shows the X-ray diffraction pattern. According to FIG. 16, in the X-ray diffraction pattern of the tantalum coating film, the (111) plane, the (200) plane, the (221) plane, and the (220) plane were observed. Furthermore, the diffraction line of the (200) plane exhibited the highest diffraction intensity. Furthermore, the half value width of the (200) plane was 0.2 degrees or lower.

Subsequently, the tantalum coating film was carburized under the conditions below. A graphite substrate having the tantalum coating film was placed in a carburizing furnace together with a carbon source, and carburizing was carried out for an hour while the temperature in the carburizing furnace was kept at 2200 degrees Celsius and the pressure in the carburizing furnace was kept at 2.0 Pa. As a result, a tantalum carbide-coated carbon material of Example 9 was obtained.

Figure 17:
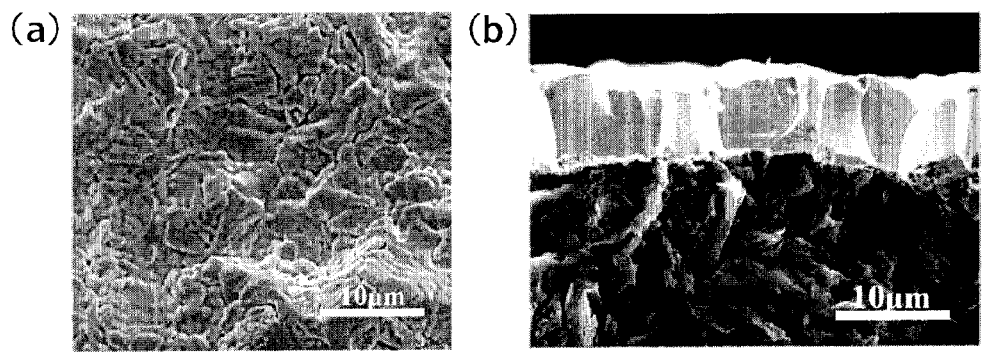
[FIG. 17] shows a result of Example 9.

Images of the surfaces of the tantalum carbide coating film of the tantalum carbide-coated carbon material obtained in Example 9, which were taken by an electron microscope, are shown in FIG. 17. FIG. 17(a) shows the surface SEM image, whereas FIG. 17(b) shows the cross sectional SEM image. As observed in FIG. 17, the tantalum carbide coating film obtained by carburizing the tantalum coating film has a significantly smaller number of grain boundaries. It is also observed that the tantalum carbide coating film fits to the irregularities on the surface of the graphite substrate.

Figure 18:
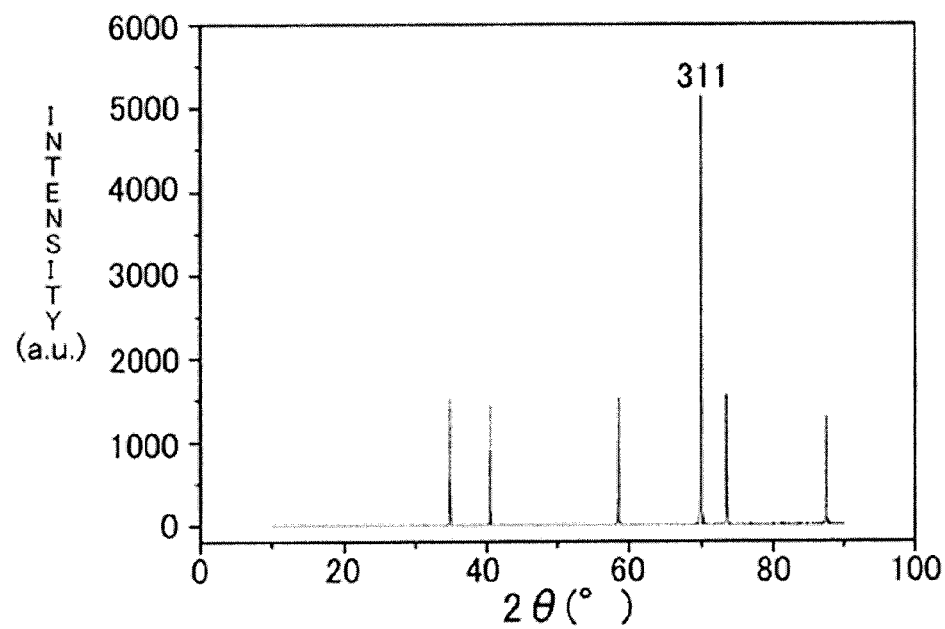
[FIG. 18] shows a result of Example 9.

Now, the result of the X-ray diffraction pattern of Example 9 is shown in FIG. 18. According to FIG. 18, in the X-ray diffraction pattern of Example 9, the (111) plane, the (200) plane, the (220) plane, the (311) plane, the (222) plane, and the (400) plane were observed. Furthermore, the diffraction line of the (311) plane exhibited the highest diffraction intensity.

Now, the sum of I(220) and I(311) with respect to Ip in Example 9 and the evaluation result of the half value width of the (311) plane of the tantalum carbide of each coating film are shown in Table 8.

TABLE 8

|  | (I(220) + I(311))/Ip | HALF VALUE WIDTH OF (311) PLANE (°) |
| --- | --- | --- |
| EXAMPLE9 | 0.61 | 10 |

According to Table 8, in Example 9 the sum of I(220) and I(311) with respect to Ip fell within the range of not lower than 0.5 and not higher than 0.90, and the half value width of the (311) plane was 0.20 or lower.

Figure 19:
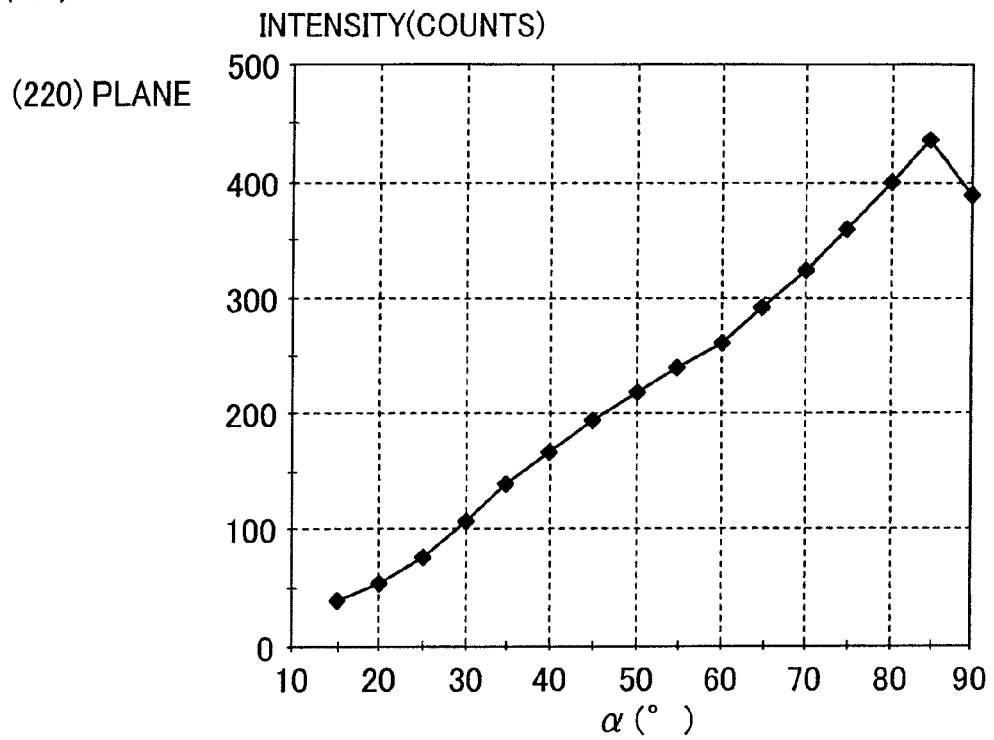
[FIG. 19] shows a result of Example 9.
Figure 19:
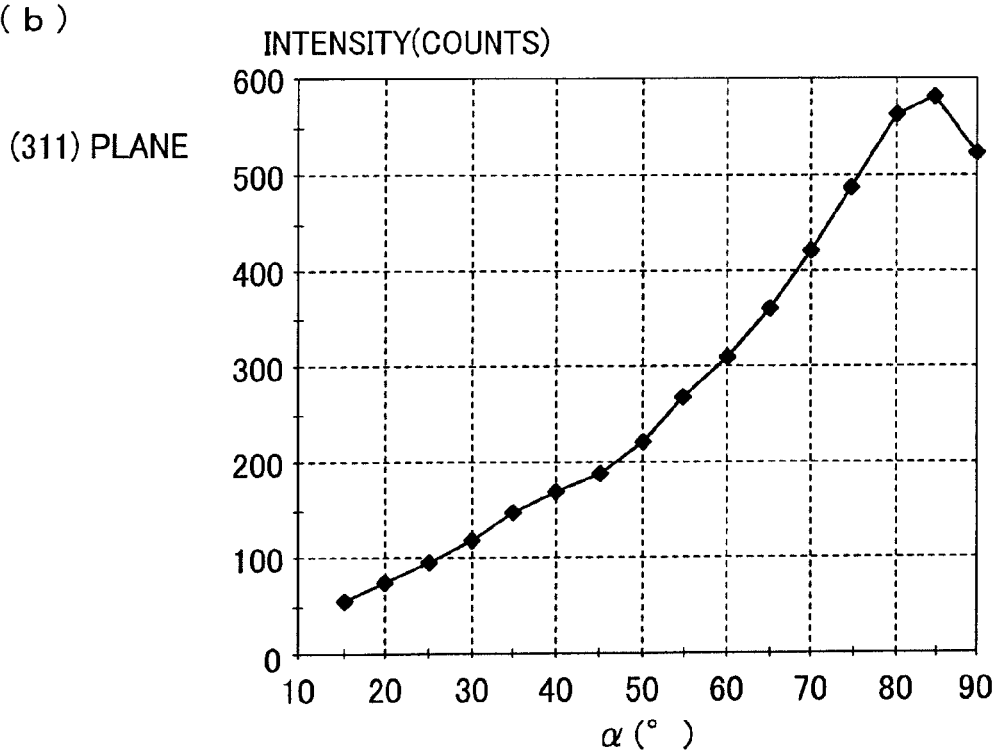

The orientation angles of the (220) plane and the (311) plane of the tantalum carbide, observed as a result of the X-ray diffraction of the surface layer of Example 9, are shown in FIG. 19. According to FIG. 19, the tantalum carbide coating film of Example 9 had a maximum peak value of at least 80 degrees in the orientation angles of the (220) plane and (311) plane corresponding to a diffraction peak of the tantalum carbide as determined by X-ray diffraction. In this case, the crystal grains of the tantalum carbide were developed and the number of grain boundaries in the tantalum carbide coating film was small.

Furthermore, after the thermal treatment of the tantalum carbide coating film obtained in Example 9 at 1600 degrees Celsius, no voids were observed on the surface of the tantalum carbide coating film.

Example 10

In this example, a tantalum carbide coating film was formed by the above-described formation method (4) of the tantalum carbide coating film using carburization.

Figure 20:
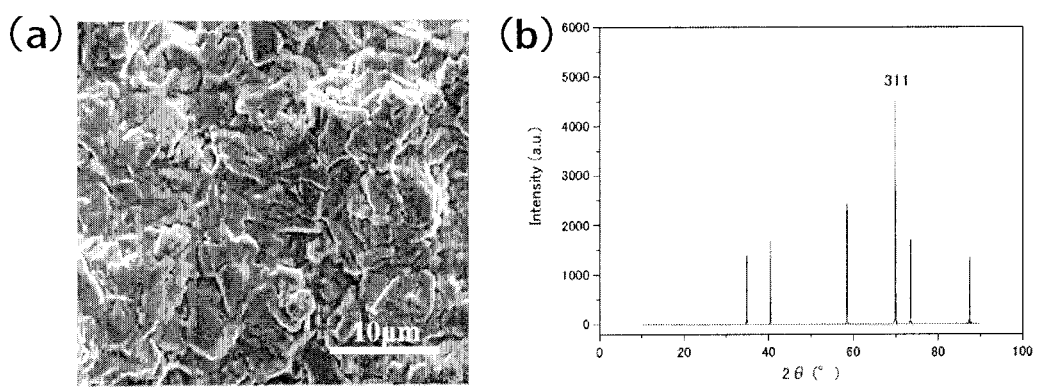
[FIG. 20] shows a result of the tantalum carbide coating film which is the base in Example 10.

First of all, a base tantalum carbide coating film was formed on a graphite substrate in the same manner as Example 9. An image (SEM image) of the surface of the base tantalum carbide coating film, which was taken by an electron microscope, and the X-ray diffraction pattern are shown in FIG. 20. FIG. 20(a) shows the SEM image whereas FIG. 20(b) shows the X-ray diffraction pattern. According to FIG. 20, in the X-ray diffraction pattern of the base tantalum carbide coating film, the (111) plane, the (200) plane, the (220) plane, the (311) plane, the (222) plane, and the (400) plane were observed. Furthermore, the diffraction line of the (311) plane exhibited the highest diffraction intensity. Furthermore, the sum ((I(220)+I(311))/Ip) of I(220) and I(311) of the base tantalum carbide coating film with respect to Ip was 0.53, and the half value width of the (311) plane of the tantalum carbide was 0.10 degrees.

Figure 21:
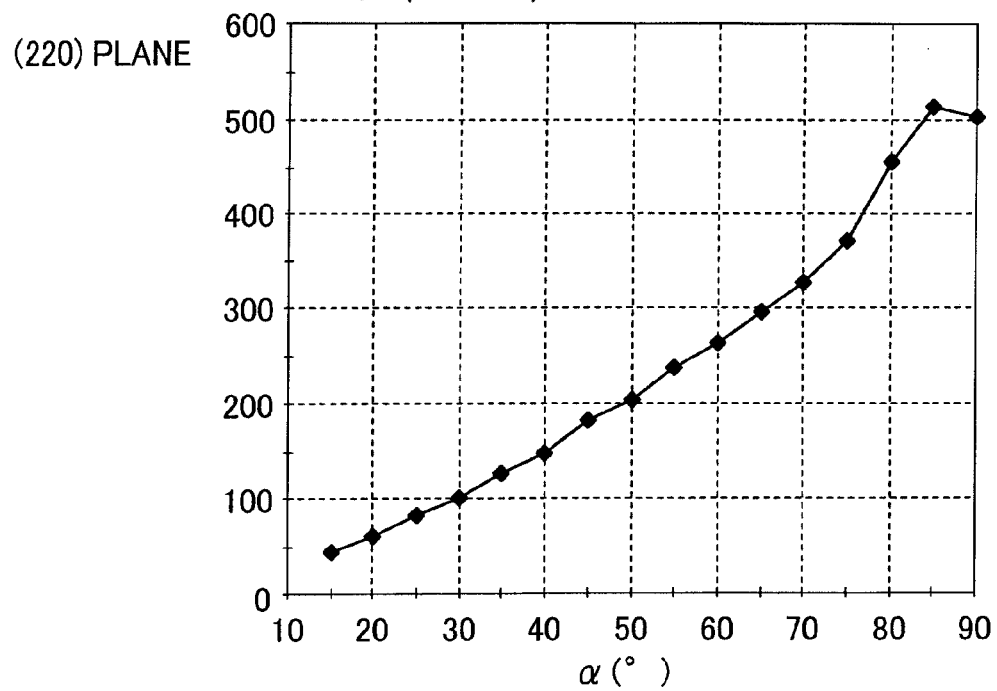
[FIG. 21] shows a result of the tantalum carbide coating film which is the base in Example 10.
Figure 21:
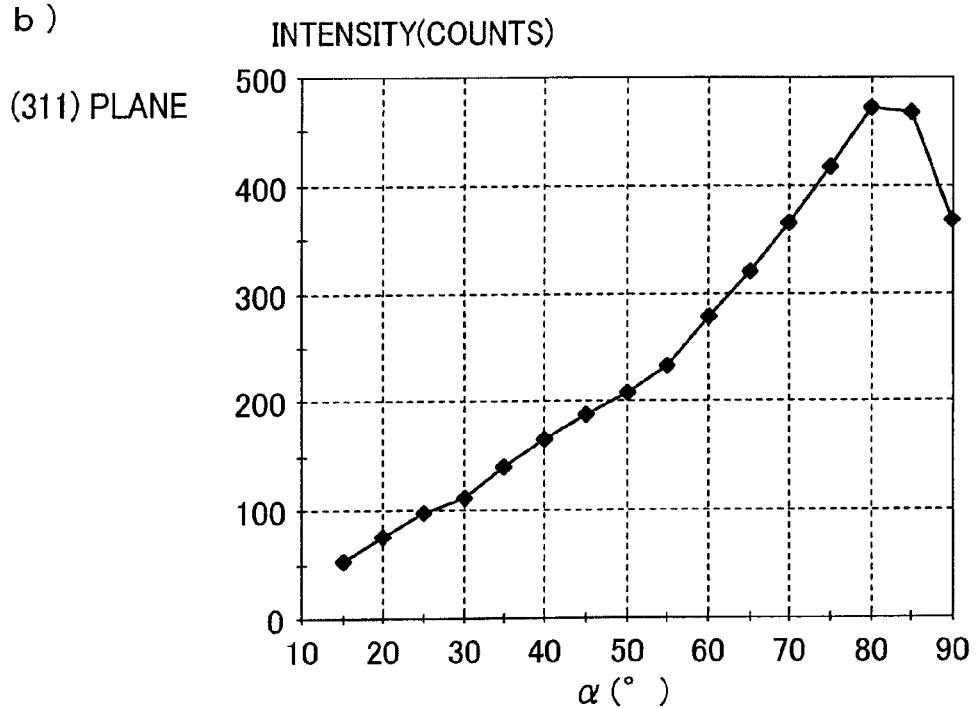

The orientation angles of the (220) plane and the (311) plane of the tantalum carbide, observed as a result of the X-ray diffraction of the surface layer of Example 10, are shown in FIG. 21. According to FIG. 21, the tantalum carbide coating film of Example 10 had a maximum peak value of at least 80 degrees in the orientation angles of the (220) plane and (311) plane corresponding to a diffraction peak of the tantalum carbide as determined by X-ray diffraction.

Now, a graphite substrate in which the base tantalum carbide coating film was formed was subjected to CVD treatment under the conditions shown in Table 9, and a tantalum carbide coating film was formed.

TABLE 9

| | TEMPERATURE (°) | PRESSURE (TORR) | TANTALUM PENTACHLORIDE (SCCM) | METHANE (SCCM) | ARGON (SCCM) |
|---|---|---|---|---|---|
| EXAMPLE10 | 1000 | 5 | 20 | 100 | 4000 |

Figure 22:
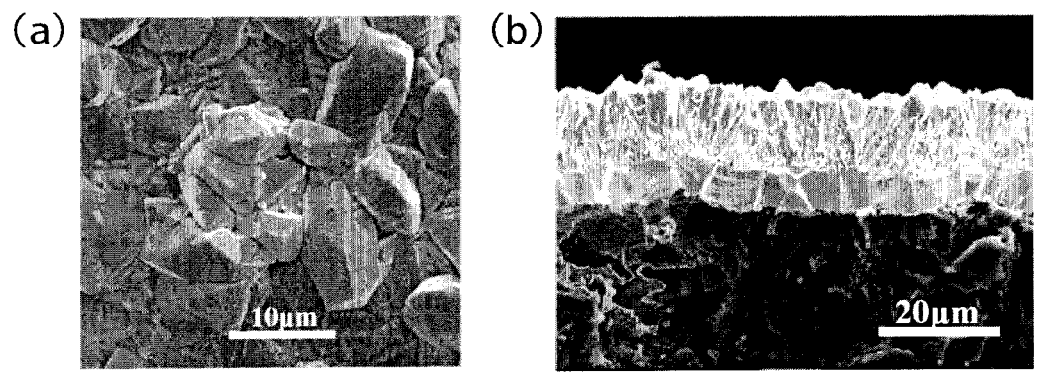
[FIG. 22] shows a result of Example 10.

Images of the surfaces of the new tantalum carbide coating film obtained by the CVD treatment, which were taken by an electron microscope, are shown in FIG. 22. FIG. 22(a) shows the surface SEM image whereas FIG. 22(b) shows the cross sectional SEM image. As observed in FIG. 22, because the tantalum carbide coating film grew in succession to the growth of the crystal grains of the base tantalum carbide coating film, the cross sectional SEM image of FIG. 22(b) shows that two different types of tantalum carbide coating films were deposited.

Figure 23:
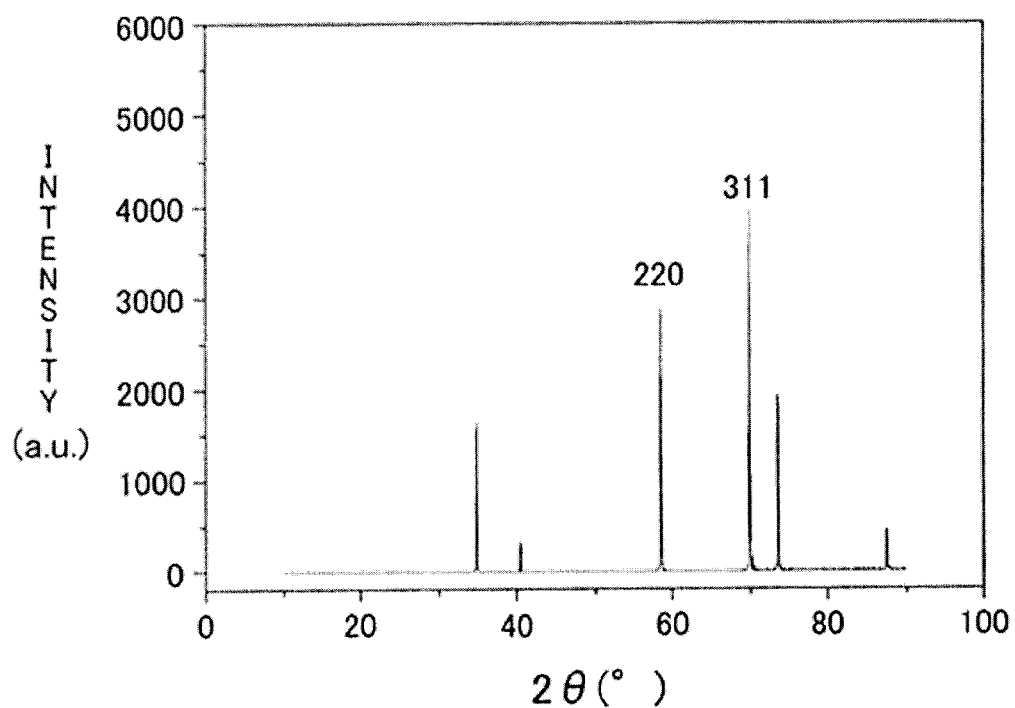
[FIG. 23] shows a result of Example 10.

Now, the result of the X-ray diffraction pattern of a new tantalum carbide coating film obtained under the conditions of Example 10 is shown in FIG. 23. According to FIG. 23, in the X-ray diffraction pattern of Example 10, the (111) plane, the (200) plane, the (220) plane, the (311) plane, the (222) plane, and the (400) plane were observed. Furthermore, the diffraction line of the (311) plane exhibited the highest diffraction intensity. This seems to be because the new tantalum carbide coating film grew in succession to the crystal orientation of the base tantalum carbide coating film.

Now, the sum of I(220) and I(311) with respect to Ip in Example 10 and the evaluation result of the half value width of the (311) plane of the tantalum carbide of each coating film are shown in Table 8.

TABLE 10

| | (I(220) + I(311))/Ip | HALF VALUE WIDTH OF (311) PLANE (°) |
|---|---|---|
| EXAMPLE10 | 0.61 | 0.10 |

According to Table 10, in Example 10 the sum of I(220) and I(311) with respect to Ip fell within the range of not lower than 0.5 and not higher than 0.90, and the half value width of the (311) plane was 0.20 or lower.

Figure 24:
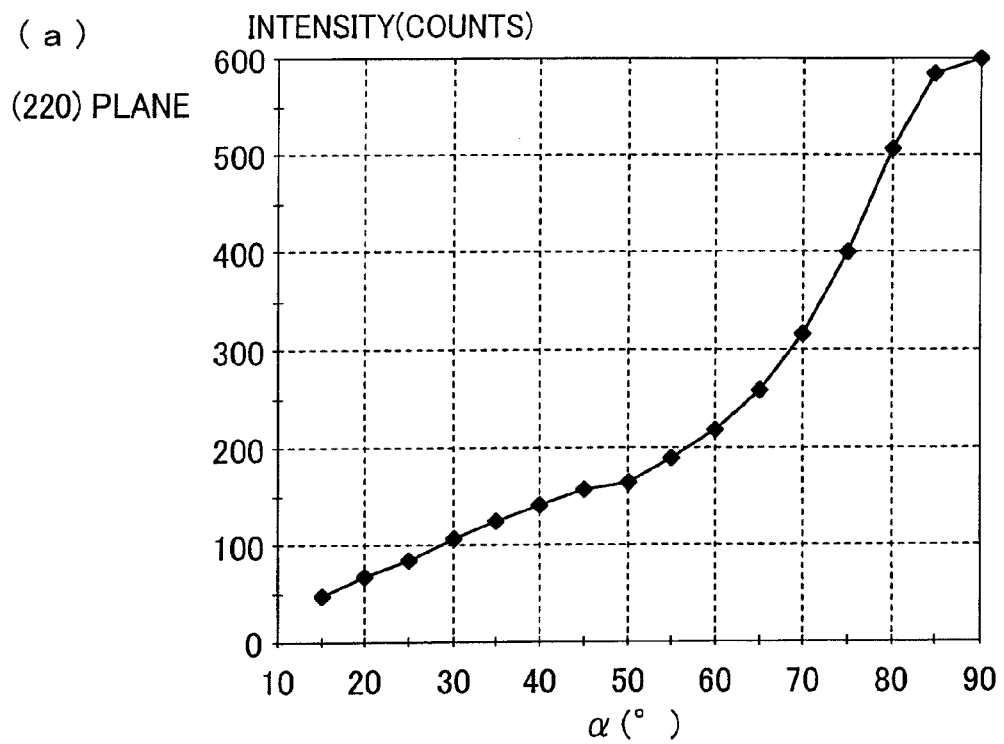
[FIG. 24] shows a result of Example 10.
Figure 24:
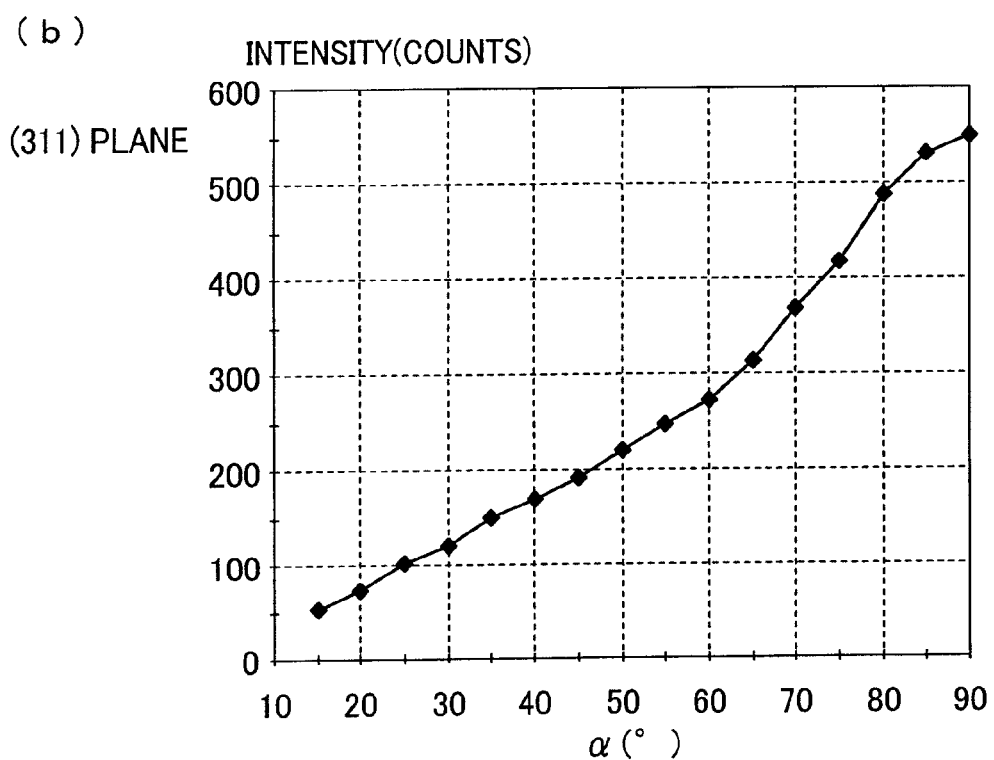

The orientation angles of the (220) plane and the (311) plane of the tantalum carbide, observed as a result of the X-ray diffraction of the surface layer of Example 10, are shown in FIG. 24. According to FIG. 24, the tantalum carbide coating film of Example 10 had a maximum peak value of at least 80 degrees in the orientation angles of the (220) plane and (311) plane corresponding to a diffraction peak of the tantalum carbide as determined by X-ray diffraction. In this case, the crystal grains of the tantalum carbide were developed and the number of grain boundaries in the tantalum carbide coating film was small.

Furthermore, after the thermal treatment of the tantalum carbide coating film obtained in Example 10 at 1600 degrees Celsius, no voids were observed on the surface of the tantalum carbide coating film.

Comparative Examples 1 and 2

A graphite substrate in which the thermal expansion coefficient was $7.8 \times 10^{-6}$/K, the gas release pressure was $10^{-6}$ Pa/g at a reference temperature of 1000 degrees Celsius, the ash content was 2 ppm, the diameter was 60 mm, and the thickness was 10 mm was subjected to CVD treatment under the CVD treatment conditions shown in Table 11 below, with the result that a tantalum carbide coating film was formed on the graphite substrate. In this connection, the composition ratio C/Ta of the tantalum carbide coating film was adjusted to 1.0 to 2.0.

TABLE 11

| | TEMPERATURE (°) | PRESSURE (TORR) | TANTALUM PENTACHLORIDE (SCCM) | PROPANE (SCCM) | ARGON (SCCM) |
|---|---|---|---|---|---|
| COMPARATIVE EXAMPLE1 | 840 | 10 | 20 | 250 | 4000 |
| COMPARATIVE EXAMPLE2 | 800 | 10 | 20 | 250 | 4000 |

An image of the surface of the tantalum carbide coating film of the tantalum carbide-coated carbon material obtained in Comparative Example 1, which was taken by an electron microscope, and the X-ray diffraction pattern are shown in FIG. 25. FIG. 25(a) shows the SEM image whereas FIG. 25(b) shows the X-ray diffraction pattern. According to FIG. 25, there were many small crystal grains on the surface of the tantalum carbide coating film shown in the SEM image of Comparative Example 1. In the X-ray diffraction pattern of Comparative Example 1, the (111) plane, the (200) plane, the (220) plane, the (311) plane, the (222) plane, and the (400) plane were observed. Furthermore, the diffraction line of the (220) plane exhibited the highest diffraction intensity. Furthermore, the half value width of the tantalum carbide (220) plane was 0.15 degrees.

Figure 26:
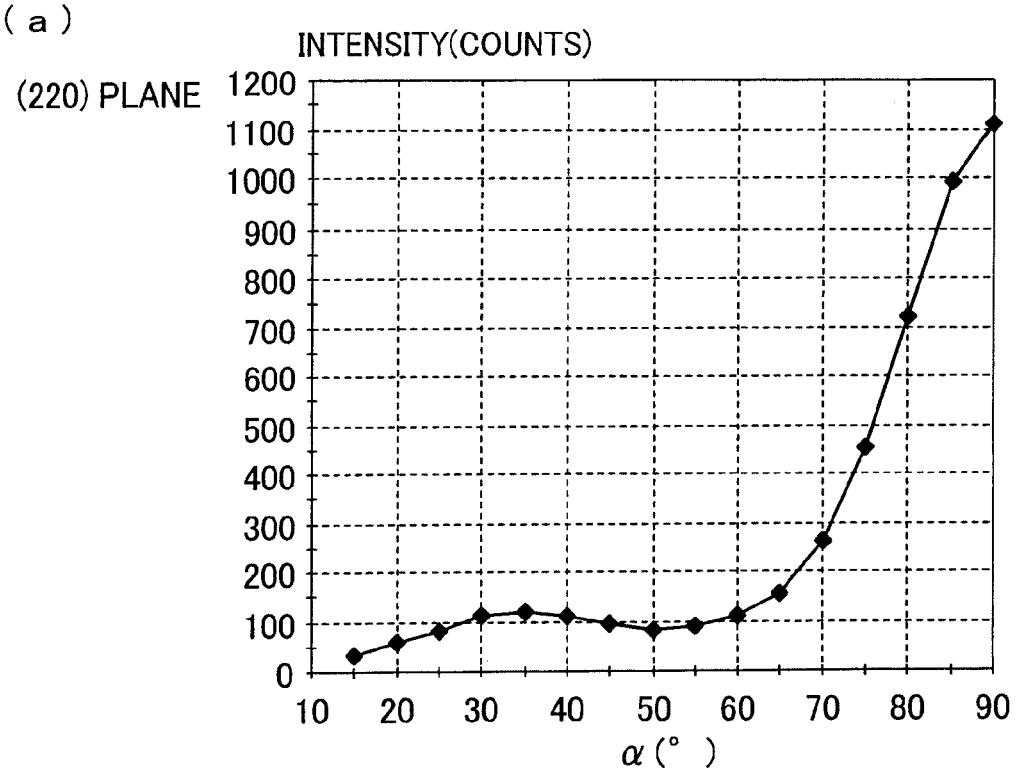
[FIG. 26] shows a result of Comparative Example 1.
Figure 26:
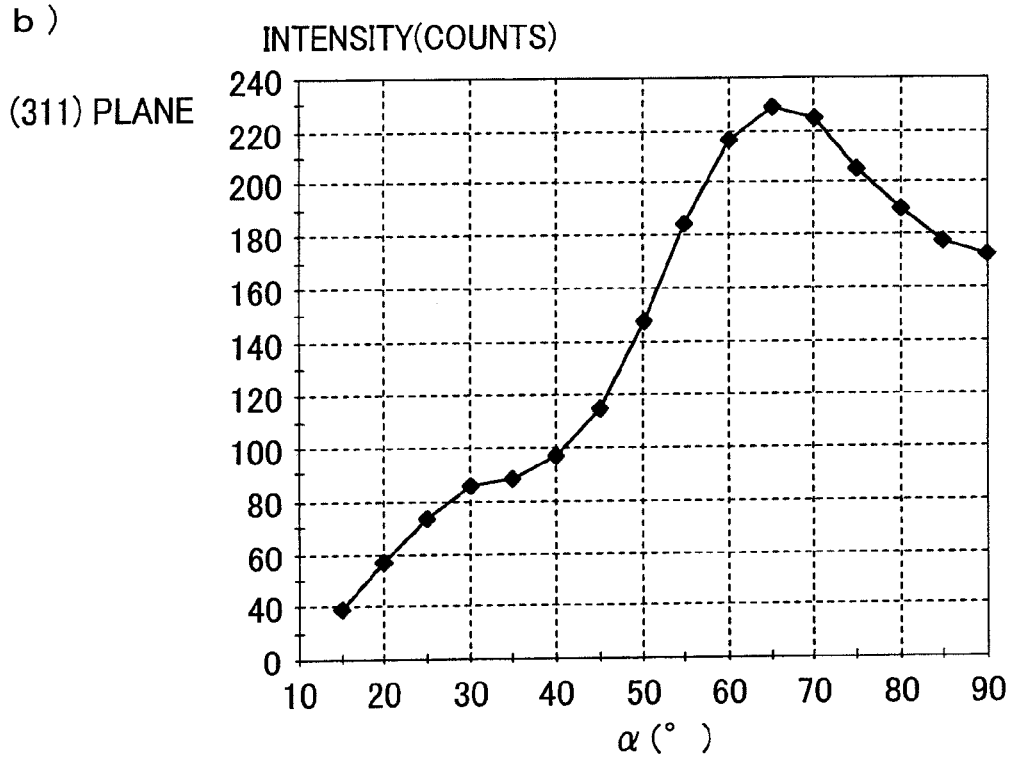

The orientation angles of the (220) plane and the (311) plane of the tantalum carbide, observed as a result of the X-ray diffraction of the surface layer of Comparative Example 1, are shown in FIG. 26. According to FIG. 26, the tantalum carbide coating film of Comparative Example 1 has a maximum peak value of at least 80 degrees in the orientation angle of the (220) plane corresponding to a diffraction peak of the tantalum carbide as determined by X-ray diffraction. The peak value of the (311) plane corresponding to the (220) plane exhibiting the maximum peak value was observed at a position where the orientation angle is deviated for about 31.5 degrees. This indicates that the (220) plane of each of the crystal grains constituting the tantalum carbide coating film of Comparative Example 1 are predominantly in parallel to the surface of the carbon substrate. Furthermore, the maximum peak value of the (311) plane was at an angle of less than 80 degrees. For these reasons, the tantalum carbide coating film of Comparative Example 1 had many grain boundaries because the growth of the crystal grains were obstructed.

Figure 27:
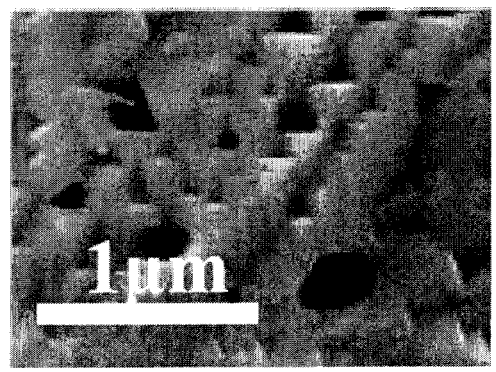
[FIG. 27] shows a result of Comparative Example 1.

Now, the result of observation of the surface of the tantalum carbide coating film after the tantalum carbide-coated carbon material formed under the CVD treatment conditions of Comparative Example 1 was thermally treated at 1600 degrees Celsius will be described with reference to FIG. 27. As shown in FIG. 27, many voids were formed on the tantalum carbide coating film. Furthermore, as the surface of the tantalum carbide coating film was observed after the tantalum carbide-coated carbon material formed at the CVD treatment conditions of Comparative Example 2 was thermally treated at 1600 degrees Celsius, voids were formed in a similar manner on the tantalum carbide coating film of Comparative Example 2.

Comparative Example 3

By the method similar to Comparative Example 1, a base tantalum carbide coating film was formed in a graphite substrate. The obtained tantalum carbide-coated carbon material was subjected to CVD treatment under the same CVD conditions as Comparative Example 1 (Table 11), with the result that a new tantalum carbide coating film was formed on the base tantalum carbide coating film. An image (SEM image) of the cross section of the obtained tantalum carbide-coated carbon material, which was taken by an electron microscope, is shown in FIG. 28.

Figure 28:
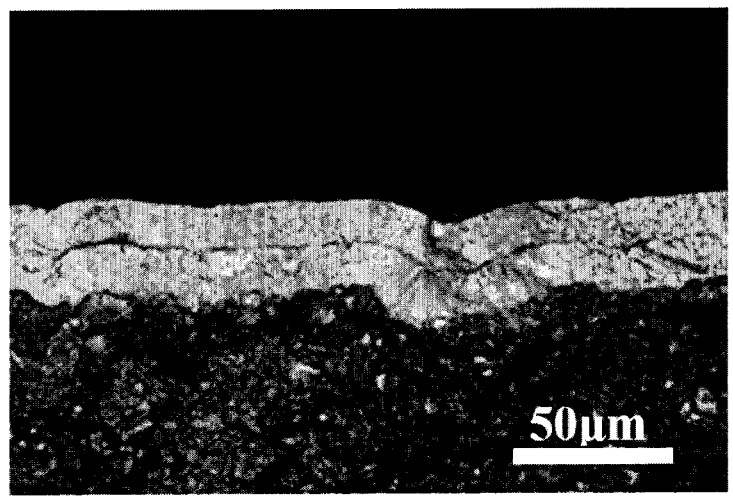
[FIG. 28] shows a result of Comparative Example 3.

FIG. 28 shows that there was a clear border between the tantalum carbide coating film and the new tantalum carbide coating film. In Comparative Example 3, impurities were released from the base tantalum carbide coating film at the time of the formation of the new tantalum carbide coating film, and the impurity gas was trapped between the base tantalum carbide coating film and the tantalum carbide coating film. It was confirmed that the new tantalum carbide coating film peeled off. Furthermore, after the base tantalum carbide coating film formed in Comparative Example 3 was thermally treated, when a new tantalum carbide coating film was formed under the same conditions (multiple coating), it was confirmed that the base tantalum carbide coating film and the new tantalum carbide coating film were significantly different in the crystallinity, and therefore the new tantalum carbide coating film did not closely contact the base tantalum carbide coating film.

The scope of the present invention is not limited only to the preferred embodiment and the examples above. The protection scope of the present invention must be analyzed by the appended claims and it should be analyzed that all spirits within a scope equivalent thereto are included in the appended claims of the present invention.

REFERENCE SIGNS LIST 1, 21, 31, 41 CARBON SUBSTRATE
2, 22, 23, 32, 42 COATING FILM
400 TANTALUM CARBIDE-COATED CARBON MATERIAL

The invention claimed is:

1. A tantalum carbide-coated carbon material, comprising:
a carbon substrate; and
a tantalum carbide coating film on which the carbon substrate is provided,
wherein,
the tantalum carbide coating film comprises one or more tantalum carbide crystals,
a (311) plane of the tantalum carbide crystals has a maximum intensity at an orientation angle $\alpha$ of at least 80 degrees as determined by a pole figure measurement with an X-ray diffraction, and
a sum of diffraction intensities of the (311) plane and a (220) plane of the tantalum carbide crystals in an X-ray diffraction pattern is not lower than 0.5 and not higher than 0.9 as compared to a sum total of diffraction intensities of all crystal planes of the tantalum carbide crystals in the X-ray diffraction pattern.

2. The tantalum carbide-coated carbon material according to claim 1, wherein,
a (220) plane of the tantalum carbide crystals in the tantalum carbide coating film has a maximum intensity at the orientation angle $\alpha$ of at least 80 degrees as determined by the pole figure measurement with the X-ray diffraction.

3. The tantalum carbide-coated carbon material according to claim 1, wherein,
an intensity of a diffraction line corresponding to the (311) plane or a (220) plane in an X-ray diffraction pattern of the tantalum carbide coating film is maximum.

4. The tantalum carbide-coated carbon material according to claim 1, wherein,
in an X-ray diffraction pattern of the tantalum carbide coating film, a half value width of a diffraction line of a (220) plane or the (311) plane is 0.2 degrees or lower.

* * * * *